(12) United States Patent
Marutani et al.

(10) Patent No.: US 6,882,672 B2
(45) Date of Patent: Apr. 19, 2005

(54) POINT EMISSION TYPE LIGHT EMITTING ELEMENT AND CONCENTRATING POINT EMISSION TYPE LIGHT EMITTING ELEMENT

(75) Inventors: Yukitoshi Marutani, Anan (JP); Akira Kitano, Anan (JP); Susumu Harada, Anan (JP); Kazuyuki Akaishi, Anan (JP); Masahiko Sano, Anan (JP); Koji Honjo, Anan (JP); Hitoshi Maegawa, Anan (JP)

(73) Assignee: Nichia Corporation, Tokushima (JP)

( * ) Notice: Subject to any disclaimer, the term of this patent is extended or adjusted under 35 U.S.C. 154(b) by 116 days.

(21) Appl. No.: 10/098,631

(22) Filed: Mar. 18, 2002

(65) Prior Publication Data

US 2002/0167983 A1 Nov. 14, 2002

(30) Foreign Application Priority Data

| Mar. 21, 2001 | (JP) | ................................... P 2001-080593 |
| Jul. 27, 2001 | (JP) | ................................... P 2001-227386 |
| Mar. 14, 2002 | (JP) | ................................... P 2001-070106 |

(51) Int. Cl.$^7$ ................................. H01S 5/00
(52) U.S. Cl. ........................ 372/49; 372/43; 372/45
(58) Field of Search ........................ 372/9, 43–50, 372/101, 108

(56) References Cited

U.S. PATENT DOCUMENTS

| 5,428,227 | A | * | 6/1995 | Satoh | ........................ 257/95 |
| 5,640,410 | A | * | 6/1997 | Yang | ............................ 372/46 |
| 6,031,857 | A | * | 2/2000 | Kinoshita | ..................... 372/46 |
| 6,037,189 | A | * | 3/2000 | Goto | ............................ 438/31 |
| 6,058,125 | A | * | 5/2000 | Thompson | ................... 372/50 |
| 6,134,368 | A | * | 10/2000 | Sakata | ......................... 385/131 |
| 6,455,342 | B1 | * | 9/2002 | Kobayashi et al. | ........... 438/33 |

* cited by examiner

Primary Examiner—David Porta
Assistant Examiner—Davienne Monbleau
(74) Attorney, Agent, or Firm—Nixon & Vanderhye PC

(57) ABSTRACT

To provide a point emission type light emitting element that restricts the light emitting area within a sufficiently tiny region and can be manufactured at a low cost, the point emission type light emitting element is a light emitting element that has stripe ridge comprising an n-type layer, an active layer and a p-type layer that are formed from semiconductors on a substrate, so as to emit light from one end face of the stripe ridge, wherein the stripe ridge has a protruding portion on the end face described above and the surface of the light emitting element is covered with an shading film except for the tip of the protruding portion.

10 Claims, 19 Drawing Sheets

POINT EMISSION TYPE LIGHT EMITTING ELEMENT AND CONCENTRATING POINT EMISSION TYPE LIGHT EMITTING ELEMENT

BACKGROUND OF THE INVENTION

1. Field of the Invention

The present invention relates to a point emission type light emitting element having a light emitting area restricted within a tiny region, and to a concentrating point emission type light emitting element that concentrates light emitted thereby and outputs the light through a tiny region.

2. Description of the Related Art

The present applicant already developed nitride semiconductor light emitting diodes that emit blue and green light with high output power and are used in practical applications as light sources for large image display apparatuses. The nitride semiconductor light emitting element is manufactured, for example, by forming p-type and n-type ohmic electrodes on a multi-layer semiconductor film that is formed from a nitride semiconductor of GaN, AlN, InN or a mixed crystal thereof on a sapphire substrate, and separating the elements into chips by such processes as cleaving, RIE etching or dicing. The light emitting element made as described above emits light not only from a light emitting layer but also from cut-off surfaces and principal plane of the substrate after causing the light to repeat transmission through the other semiconductor layers and in the substrate, refraction and reflection therein.

In recent years, there have been increasing demands for light emitting elements that restrict the light emitting area within a microscopic region for such applications as the light sources for optical communication, electrophotography and virtual reality display. To meet these demands, nitride semiconductor light emitting elements of various constitutions have been proposed with the light emitting area restricted within a microscopic region.

An end face emitting type light emitting element has been proposed as a light emitting element having microscopic light source. The end face emission light emitting element employs double heterojunction structure wherein a light emitting layer is sandwiched by forming p-type and n-type semiconductor layers that have wide band gap, as the basic structure similarly to a semiconductor laser. For example, an end face emission type light emitting diode made of nitride semiconductor employs separation-confinement heterojunction structure (SCH) based on AlGaN/GaN/InGaN.

However, in the constitution of the proposed light emitting element that restricts the light emitting area within a microscopic region, a high accuracy of patterning is required to restrict the light emitting area within the microscopic region, and an advanced photolithography technology must be used. This results in the problem that the light emitting element that restricts the light emitting area within the microscopic region cannot be provided at an economical price.

Although the end face emission type light emitting diode can be made with small spot size, multi-mode light emission is produced since light is emitted not only from the end face of the light emitting layer but also from the end faces of the n-type semiconductor layer formed nearer to the substrate than the light emitting layer, thus making it unsuitable for such applications as a single spot of good near-field pattern is required.

SUMMARY OF THE INVENTION

Thus, a first object of the present invention is to provide a point emission type light emitting element that restricts the light emitting area within a sufficiently tiny region and can be manufactured at a low cost, and a method of manufacturing the same.

A second object of the present invention is to provide a concentrating point emission type light emitting element that produces a single spot light of good near-field pattern with a high efficiency of light emission.

The point emission type light emitting element according to the present invention to meet the first object described above is a light emitting element that has stripe ridge comprising an n-type layer, an active layer and a p-type layer that are formed from semiconductors on a substrate, so as to emit light from one end face of the stripe ridge, wherein the stripe ridge has a protruding portion on the end face described above and the surface of the light emitting element is covered with an shading film except for the tip of the protruding portion.

In the point emission type light emitting element of the present invention constituted as described above, since the surface of the light emitting element is covered with the shading film except for the tip of the protruding portion, light emitting area can be restricted to the tip of the protruding portion.

Therefore, according to the present invention, light can be emitted only from the tip of the protruding portion, and the light emitting area can be made extremely small by setting the width of the protruding portion in accordance to the light emitting area that is required.

Also because the surface of the light emitting element is covered with the shading film except for the tip of the protruding portion, leakage of light from other portions than the tip of the protruding portion can be suppressed, thereby increasing the efficiency of light emission.

Also the n-type layer, the active layer and the p-type layer of the point emission type light emitting element of the present invention can be formed from nitride semiconductors, which makes it possible to emit light of relatively short wavelength.

The method of manufacturing the point emission type light emitting element according to the present invention is, in order to achieve the first object described above, a method of manufacturing the point emission type light emitting element by forming a plurality of elements on the substrate and dividing the substrate with layers formed thereon into individual elements, and comprises a step of forming the n-type layer, the active layer and the p-type layer on the substrate one on another, a step of forming stripe ridge that has a neck portion formed near one end thereof having narrower width than the other portion in correspondence to the elements described above, a step of forming shading films at least on one end face of the stripe ridge and the top surface and both side faces of the neck portion, and a step of dividing the elements at the neck portion along a direction perpendicular to the longitudinal direction of the stripe ridge.

According to the method of manufacturing the point emission type light emitting element of the present invention constituted as described above, the light emitting element having the light emitting area restricted within a tiny region located at the end of the stripe ridge can be easily manufactured, and the light emitting area that has extremely small light emitting area can be manufactured at a low cost.

The concentrating point emission light emitting element according to the present invention to meet the second object described above is a surface emission type light emitting element made in stacked semiconductor structure of double heterojunction structure wherein an active layer is sandwiched by a p-type semiconductor layer and an n-type semiconductor layer that have band gap larger than that of the active layer so as to emit light from a light emitting point located in the surface of the p-type semiconductor layer, where such a pyramidal surface is provided in the stacked semiconductor structure located right below the light emitting point that reflects the light upward or retracts the light, the stacked semiconductor structure is divided into a plurality of light emitting regions located around the pyramidal surface that is at the center, and ridges of smaller width than the light emitting region are s formed on the p-type semiconductor layer so that light emitted from the light emitting regions is directed toward the pyramidal surface.

In the concentrating point emission type light emitting element of the present invention constituted as described above, since the waveguide is formed in each of the light emitting regions, that light emitted in the light emitting regions is directed toward the light emitting point so as to be reflected or refracted by the pyramidal surface and is output through a narrow region, and therefore the element can be used as a point light source.

The concentrating point emission type light emitting element of the present invention is also capable of emitting light with a high luminance since light emitted in all light emitting regions is concentrated and output together.

Moreover, since the concentrating point emission type light emitting element of the present invention can concentrate light into a small region and output the light therefrom, a light spot of single mode having good near field pattern can be produced.

In the concentrating point emission type light emitting element of the present invention, the plurality of light emitting regions can be formed by separating the light emitting regions from each other by etching the borders between adjacent light emitting regions to a depth midway in the n-type semiconductor layer in the stacked semiconductor structure except for the light emitting point and a vicinity thereof, and forming n-type electrode on the n-type semiconductor layer that has been exposed by etching.

In the concentrating point emission type light emitting element of the present invention, the pyramidal surface can be constituted from a pyramidal cavity that has an apex located in the light emerging direction and is formed in the stacked semiconductor structure.

Moreover, in the concentrating point emission type light emitting element of the present invention, the pyramidal surface can also be formed by filling a recess of pyramidal shape, that expands toward the light emerging point and is formed so as to reach at least the n-type semiconductor layer in the stacked semiconductor structure, with a transparent material having a refractive index higher than that of the active layer.

In the concentrating point emission type light emitting element of the present invention, the pyramidal surface is preferably a conical surface, which makes it possible to produce spot light of near true circle.

DESCRIPTION OF THE PREFERRED EMBODIMENTS

Now the point emission type light emitting element according to preferred embodiments of the present invention will be described below with reference to the accompanying drawings.

Embodiment 1

Figure 1:
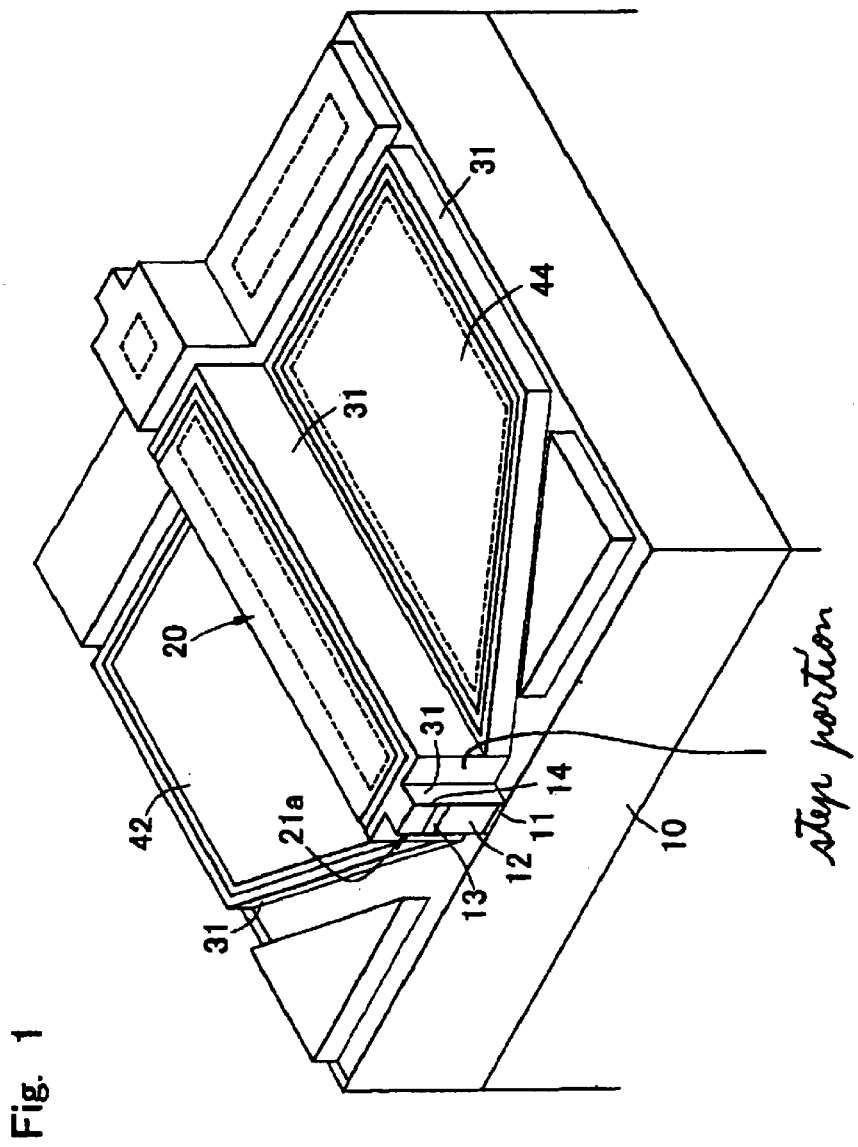
FIG. 1 is a perspective view showing the constitution of a nitride semiconductor light emitting element according to first embodiment of the present invention.

The point emission type light emitting element according to the first embodiment of the present invention is a nitride semiconductor light emitting diode. The point emission type light emitting element has such a constitutions as an n-type layer 12, an active layer 13 and a p-type layer 14 that are formed from nitride semiconductors on a substrate 10 made of sapphire via a buffer layer 11, with a stripe ridge 20 that has a protruding portion 21a being formed on one end face thereof, while being covered with an shading film 31 substantially entirely except for the tip of the protruding portion 21a, as shown in FIG. 1. The point emission type light emitting element is manufactured as described below.

Figure 2:
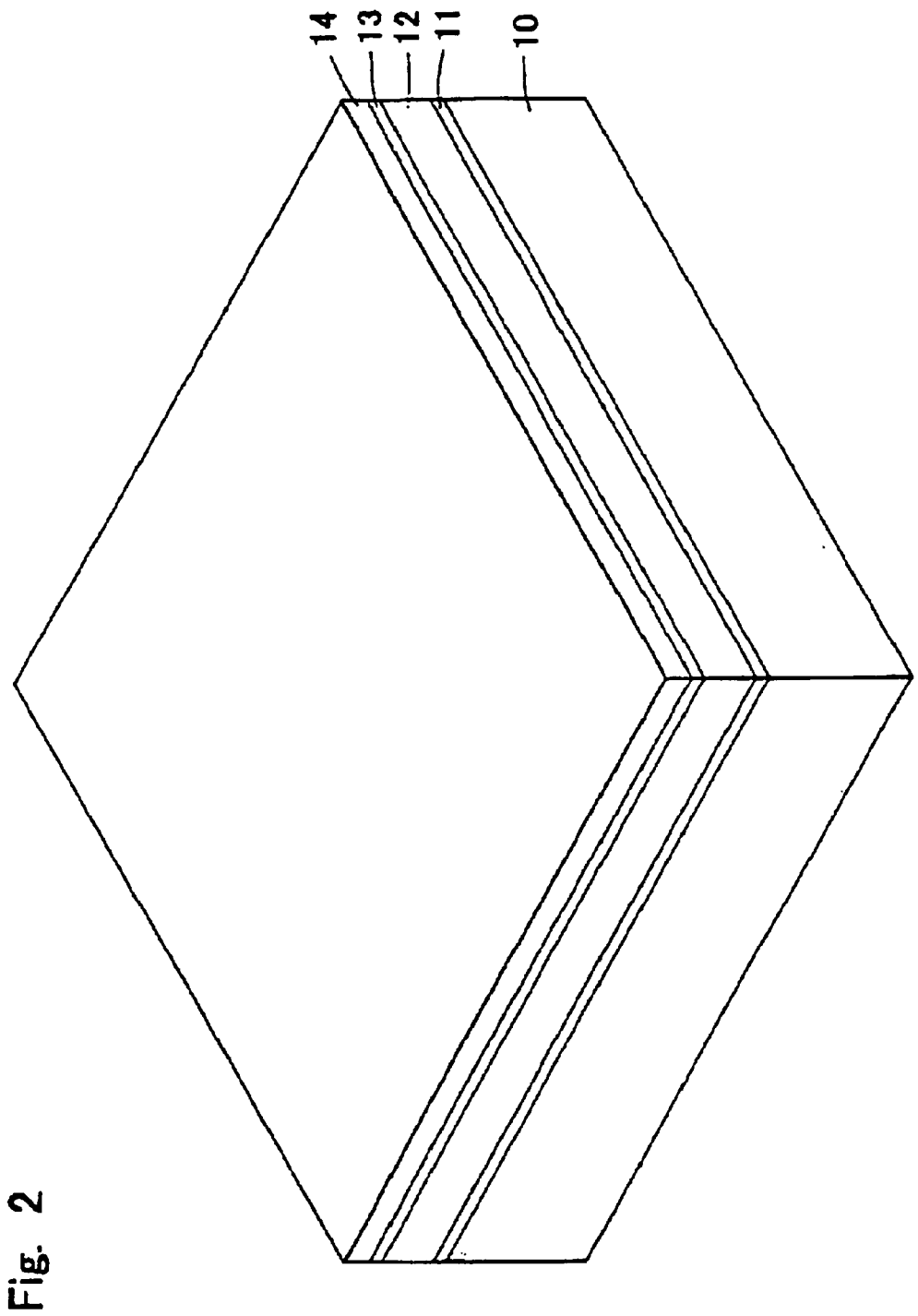
FIG. 2 is a perspective view after nitride semi conductor layer that constitutes the element is formed on a sapphire substrate in the manufacturing process of the nitride semiconductor light emitting element according to the first embodiment of the present invention.

First, as shown in FIG. 2, the buffer layer 11 made of GaN grown at a low temperature, for example, the n-type layer 12 made of GaN doped with Si, for example, the active layer 13 made of InGaN, for example, and the p-type layer 14 made of GaN doped with Mg, for example, are formed successively on the substrate 10.

Then stripe ridges 20 are formed in regions that correspond to the elements, and 2-step etching operation is carried out as described below in order to define the element regions.

In the first etching process, a first mask is formed in a region where the stripe ridge 2—would be formed, and the portion not covered by the first mask is etched by reactive ion etching (RIE) midway in depth of the n-type layer 12. The first mask used in the first etching process is formed in such a configuration as portions that correspond to front and back sides of a cleavage surface located on one end of the stripe ridge 20 are made narrower than the other portions, so that a narrow neck portion 21 is continuously formed on the end face of the stripe ridge 20 after etching.

Longer axis of the stripe ridge 20 and longer axis of the neck portion 21 preferably agree with each other.

Width of the stripe ridge is not limited to a particular value, but is preferably in a range from 1 to 100 $\mu$m, and more preferably in a range from 5 to 50 $\mu$m. When the width is less than 1 $\mu$m, it is difficult to precisely form the stripe ridge 20 and the narrower neck portion 21 by etching. When the width is greater than 100 $\mu$m, loss of light due to the nitride semiconductor increases when the light generated in the active layer is directed through the ridge 20 that is wider. When the width is 5 $\mu$m or greater, the stripe ridge 20 and the narrower neck portion 21 can be formed precisely by etching, and width within 50 $\mu$m makes it possible to minimize the loss of light and cause the light to emerge through one end face. The width is set to 20 $\mu$m in this embodiment.

According to the present invention, there is no limitation to the width of the neck portion 21 that can be determined by setting the stripe width and particularly the width of the end face that is obtained at the last, so that a light source of desired small size can be formed. Stripe width at the neck portion 21 is preferably set in a range from 1 to 10 $\mu$m. When the width is less than 1 $\mu$m, it is difficult to precisely form the neck portion 21 by etching. Width greater than 10 $\mu$m is not suitable for the tiny light source. Width of the neck portion 21 is set in a range from 2 to 3 $\mu$m in this embodiment. According to the present invention, there is also no limitation to the length of the neck portion 21 that can be set so that it is convenient for cleaving operation to obtain the end face. Specifically, the length is preferably set in a range from 1 to 50 $\mu$m, and more preferably in a range from 5 to 30 $\mu$m. When the length is less than 1 $\mu$m, there arises a problem related to the accuracy in etching. Length of 5 $\mu$m or larger makes it possible to cleave at the neck portion 21 where there is less probability of defects being included. When cleaving a material such as sapphire that is different from the nitride semiconductor, there is a possibility of cleaving to take place at a wrong place, and a length less than 5 $\mu$m increases the possibility of much cleavage defects to occur in the neck portion 21, that can be reduced by setting the length to 5 $\mu$m or larger. Although cleavage can be carried out without increasing the number of cleavage defects when the length is larger than 50 $\mu$m, this reduces the number of chips produced per wafer. When the length is 30 $\mu$m or less, good cleavage and satisfactory yield of production can be achieved, while securing a certain number of chips produced per wafer. The length is set to 10 $\mu$m in this embodiment.

In the second etching process, a second mask is formed over the area except for the separation regions where the elements are to be divided, leaving the first mask used in the first etching process to remain, and the nitride semiconductor layer is removed from the separation regions by etching midway in depth of the buffer layer 11 or to the surface of the substrate 10.

Figure 3:
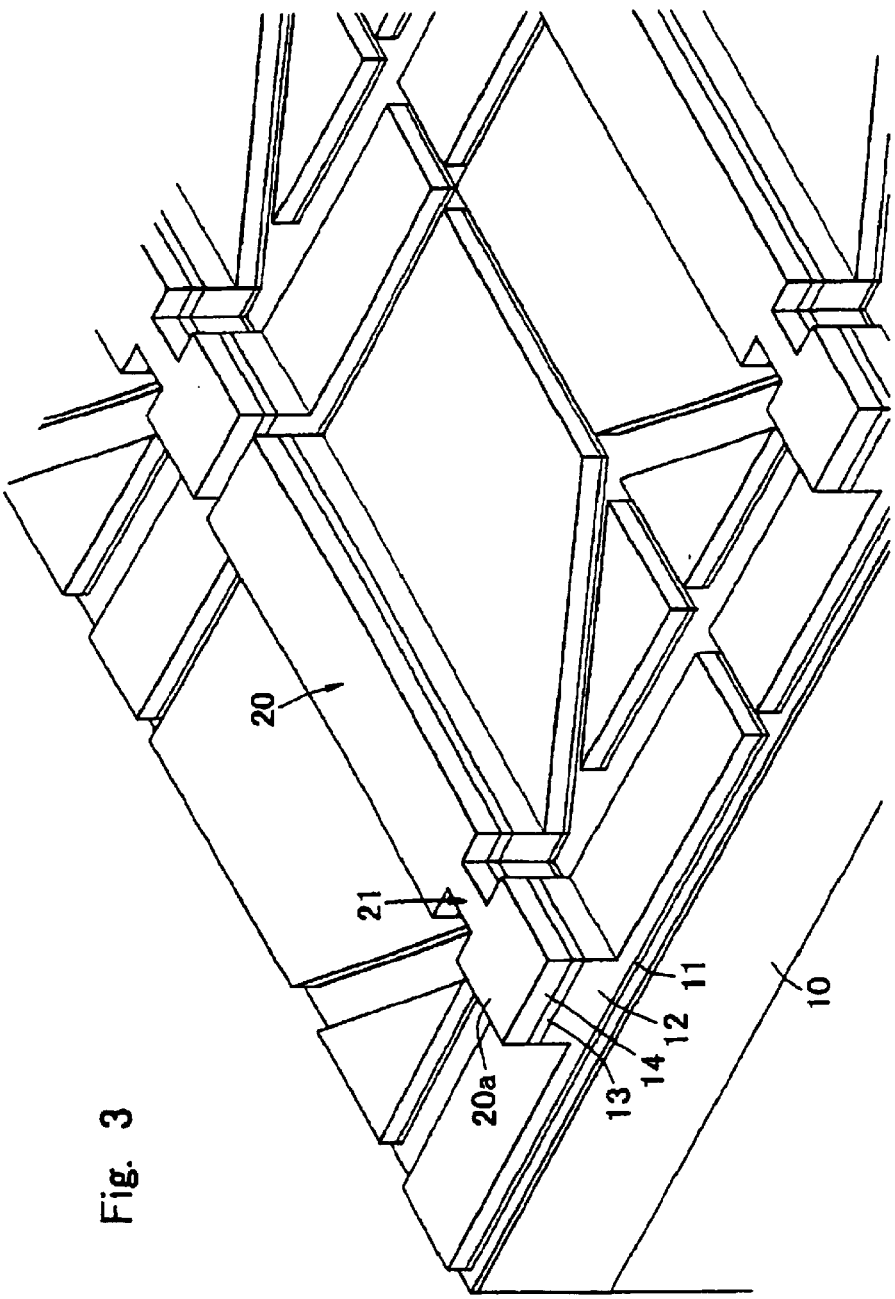
FIG. 3 is a perspective view after a ridge stripe and element regions are formed by etching in the manufacturing process of the nitride semiconductor light emitting element according to the first embodiment of the present invention.

Thus the 2-step etching process results in the element regions each having the stripe ridge 20 and the neck portion 21 being formed in correspondence to the elements to be separated (FIG. 3).

Figure 4:
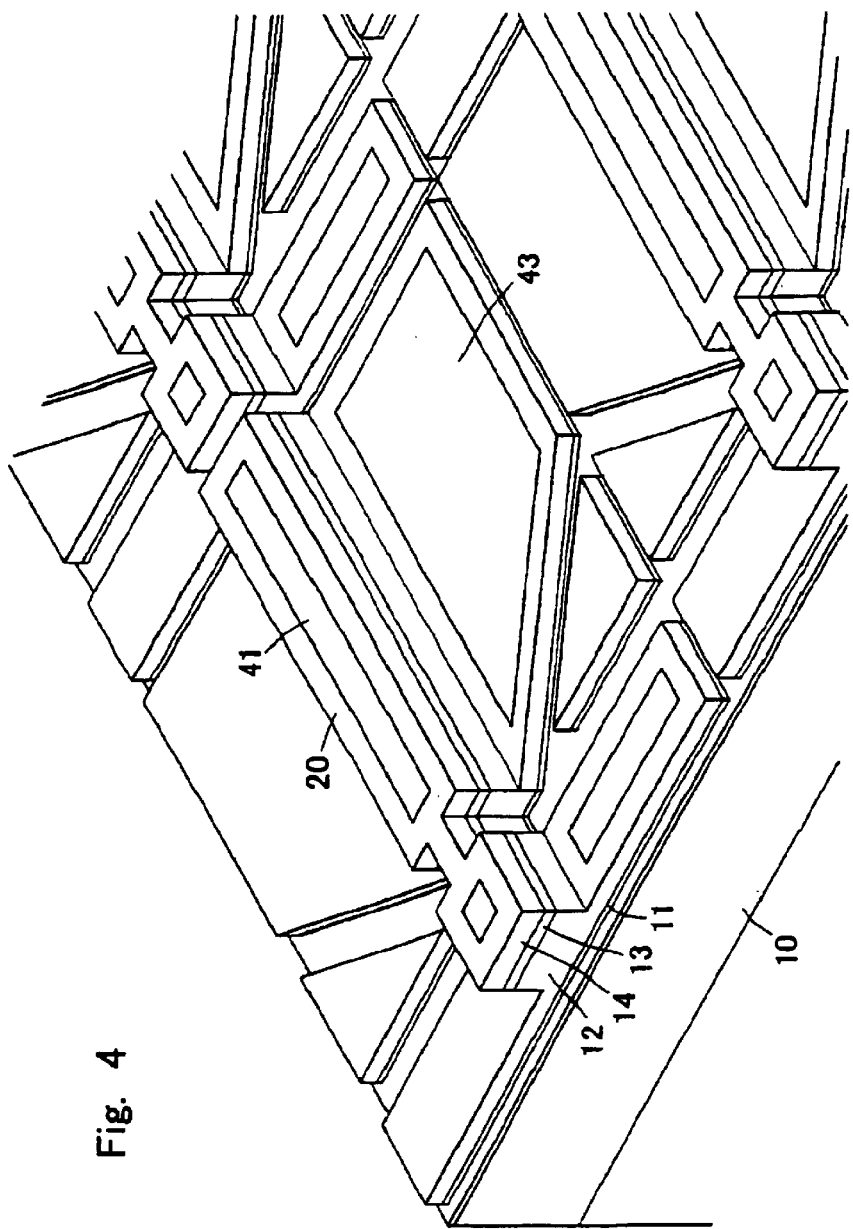
FIG. 4 is a perspective view after a p-type electrode and an n-type electrode are formed in the manufacturing process of the nitride semiconductor light emitting element according to the first embodiment of the present invention.

Then as shown in FIG. 4, a p-type ohmic electrode 41 is formed on the p-type layer 14 of the stripe ridge 20, and an n-type ohmic electrode 43 is formed on the surface of the n-type layer that is exposed on the outside of one side face of the stripe ridge 20.

The entire surface of the wafer is covered with a $SiO_2$ film (not shown) except for the top surface of the p-typo ohmic electrode 41 and the top surface of the n-type ohmic electrode 43 of each electrode region. Then a p pad electrode 42 is formed in contact with the p-type ohmic electrode 41 that is exposed through the opening in the $SiO_2$ film, and an n pad electrode 44 is formed in contact with the n-type ohmic electrode 43 that is exposed through the opening in the $SiO_2$ film (FIG. 5).

Figure 5:
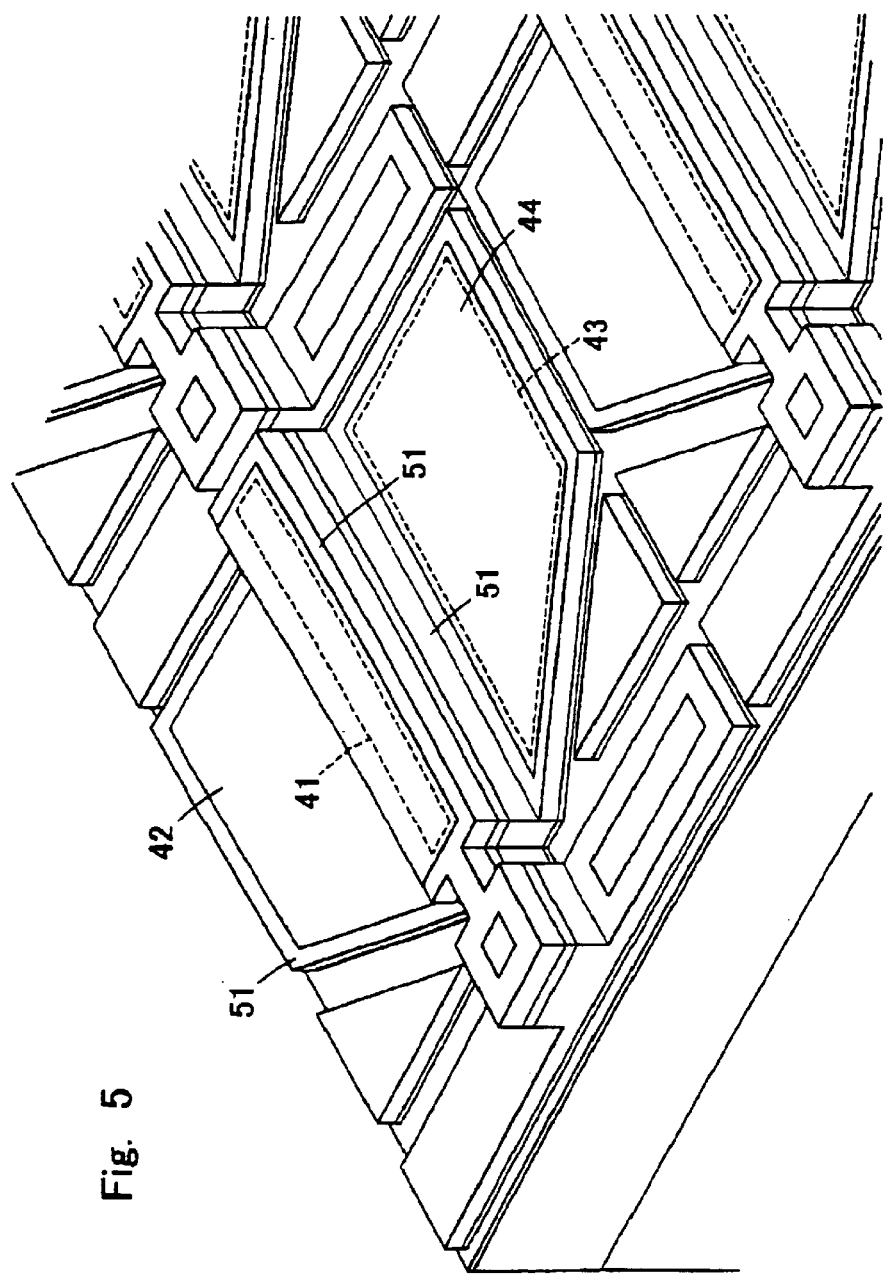
FIG. 5 is a perspective view after a p pad electrode and an n pad electrode are formed in the manufacturing process of the nitride semiconductor light emitting element according to the first embodiment of the present invention.
Figure 6:
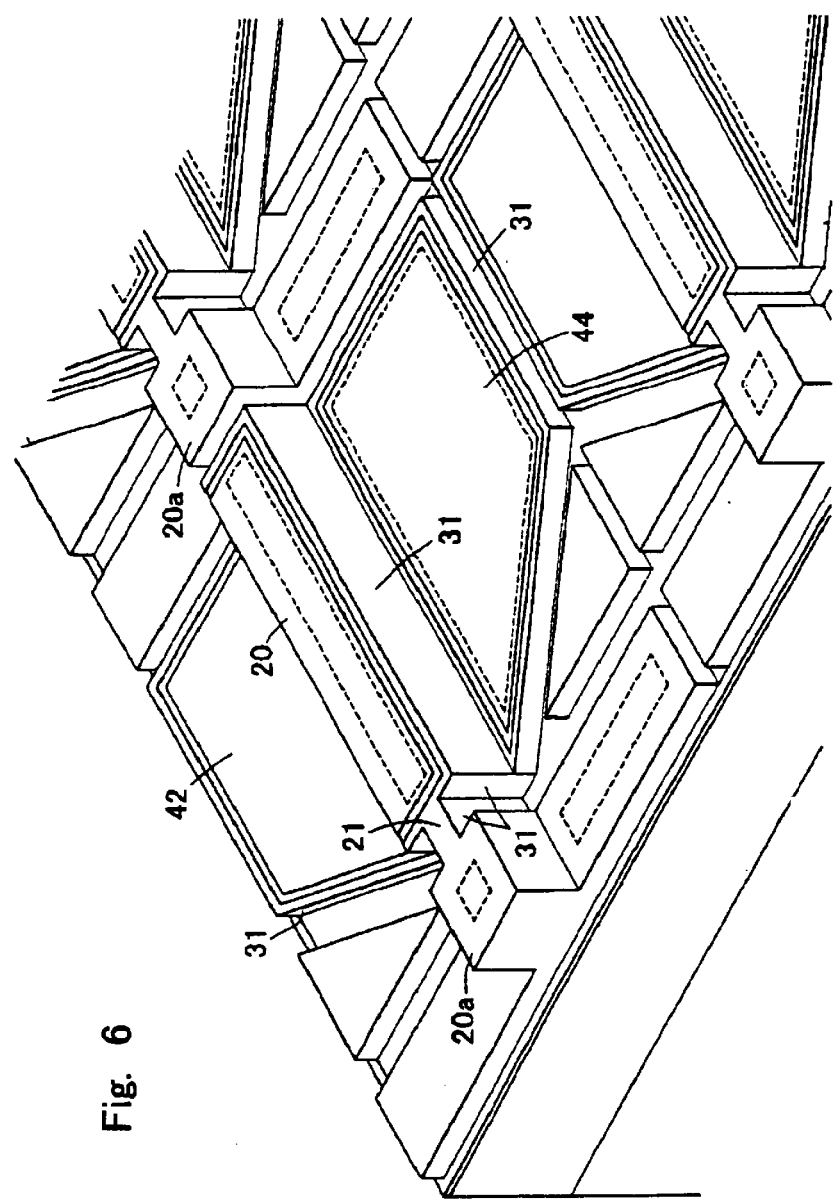
FIG. 6 is a perspective view after an shading film is formed to cover the top surface of the element in the manufacturing process of the nitride semiconductor light emitting element according to the first embodiment of the present invention.
Figure 7:
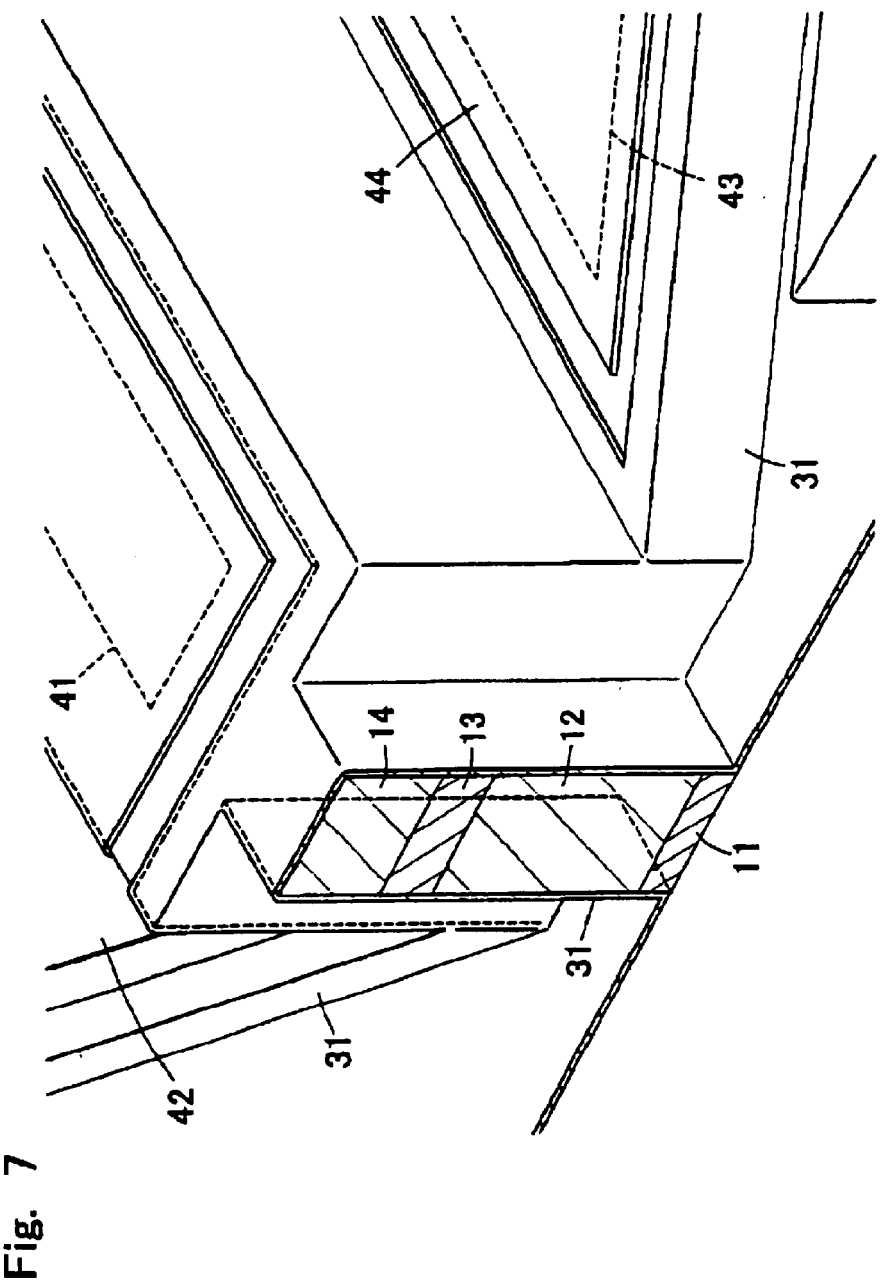
FIG. 7 is an enlarged perspective view showing the end of the ridge stripe in the nitride semiconductor light emitting element according to the first embodiment of the present invention.

As shown in FIG. 5, the n pad electrode 44 is formed so as to overlap with the n-type ohmic electrode 43, and the p pad electrode 42 is formed so as to make contact with p-type ohmic electrode on the top surface of the stripe ridge 20 and extend therefrom over the other side face of the stripe ridge 20 and over the $SiO_2$ film located on the outside of the side face.

Then a mask is formed to cover the n pad electrode 44 and the vicinity thereof and the p pad electrode 42 and the vicinity thereof. The mask is used to form a metal film (shading film) of Cr/Au (Au film formed over a thin film of Cr) covering the entire wafer with a vapor deposition or sputtering apparatus. Thus the shading film 31 is formed to cover substantially the entire surface of the wafer including one side face of the stripe ridge 20 and both side faces of the neck portion 21.

At this time, the top surface of the wafer is covered by either the n pad electrode 44, the p pad electrode 42 or the shading film 31 except for the small areas of the n pad electrode 44 and the vicinity thereof and the p pad electrode 42 and the vicinity thereof.

The shading film 31, the n pad electrode 44 and the p pad electrode 42 are electrically isolated around the n pad electrode 44 and around the p pad electrode 42.

Then the wafer is divided into individual elements and the shading film 31 is formed on the side faces of the substrate 10 after separation.

The wafer having the shading film 31 formed on the top surface thereof is stuck on a heat sensitive sheet with the electrode surface (top surface) facing the sheet, and the wafer is scribed on the back surface.

The scribe line perpendicular to the longer side of the ridge stripe 20 is formed at such a position as cross the neck portion 21 at right angles at the center of the neck portion 21.

After sticking the scribed back surface of the wafer onto a die bonding sheet, the heat sensitive sheet is peeled off the wafer surface.

The individual element chips are separated from each other with a space produced in between by pulling the die bonding sheet to expand evenly in all directions.

The end face at the tip of the protruding portion 21a of each chip that has been separated is a cleavage surface created after forming the shading film 31 on the top surface of she wafer, and therefore is not covered by the shading film.

Then the electrode surfaces of the chips are pressed against an adhesive layer of an adhesive sheet, with the adhesive layer being 10 µm thick, to be stuck thereon while maintaining the distance between the chips, and the die bonding sheet is removed. At this time the chips are arranged on the adhesive sheet in an array with a predetermined distance from each other and the hack surface of the sapphire substrate 11 facing up. Each chip is secured onto the adhesive sheet with the electrode surface being pressed against the adhesive layer with a relatively large force, while providing masking function to prevent the shading film from being formed on the top surface of the chip, particularly on the end face of the protruding portion 21a of each chips during the process of forming the shading film on the back surface and the side faces of the substrate.

Then the chips arranged on the adhesive sheet in an array with a predetermined distance from each other with the back surface of the substrate facing up are set in a vapor deposition or sputtering apparatus, where a Cr film (600 Å thick, for example) and an Au film (2400 Å thick, for example) are formed successively, thus forming the shading film 31 on the back surface and the side faces of the substrate.

In the process described above, the nitride semiconductor light emitting elements are manufactured in the form of separated chips that are substantially totally covered, except for the end face of the protruding portion 21a formed to protrude from one end face of the stripe ridge 20, by either the n pad electrode 44, the p pad electrode 42 or the shading film 31 that shield light.

This provides the point emission type light emitting element that is capable of emitting light on one end face of the stripe ridge, or further from limited region of the end face of the protruding portion 21a.

The point emission type light emitting element of the first embodiment that emits light from the end face of the protruding portion 21a allows it to easily restrict the light emitting area within an extremely small region by forming the protruding portion 21a with a small width.

That is, while it is difficult to restrict the light emitting area by forming the shading film in a predetermined pattern on the end face of the stripe ridge, the constitution and the manufacturing method of the first embodiment makes it possible by a unique technique as follows: the narrow neck portion 21 is continuously formed on the end face of the stripe ridge and cleavage is carried out at the neck portion 21 after forming the shading film, and the light emitting area is restricted further within a narrow region on the light emitting end face of the stripe ridge, so that the light emitting area can be easily restricted within an extremely small region.

While the first embodiment has been described above, the present invention is not limited to the first embodiment and various modifications can be made and various materials can be used as described below.

Variation of Embodiment 1

For the substrate used in the present invention, insulating substrate such as sapphire or spinel ($MgAl_2O_4$) that has principal plane in C plane, R plane or A plane, SiC (including 6H, 4H, 3C), ZnS, ZnO, GaAs, Si and oxide substrate that makes lattice matching with nitride semiconductor have been known as materials different from nitride semiconductor. Sapphire and spinel are preferably used. A nitride semiconductor substrate such as GaN and AlN can also be used.

As the nitride semiconductor formed on the substrate, III–V group gallium nitride compound semiconductor materials can be used. For example, $In_xAl_yGa_{1-x-y}N$ ($0 \leq x \leq 1$, $0 \leq y \leq 1$, $0 \leq x+y \leq 1$), and InAlGaBN, InAlGaNP and InAlGaNAs made by adding B to the III group element or substituting a part of V group element N with As or P can be used. Good light emitting layer can be obtained by using $In_uAl_vGa_{1-u-v}N$ ($0 < u < 1, 0 \leq v < 1$, $0 \leq u+v < 1$). As the n-type impurity used for the nitride semiconductor of the present invention, IV group element such as Si, Ge, Sn, S, O, Ti or Zr, or VI group element nay be used. Good carrier can be generated by preferably using Si, Ge and Sn, and most preferably using Si. While there is no limitation to the p-type impurity, Be, Zn, Mn, Cr, Mg or Ca may be used, and Mg is preferably used. Thus the n-type nitride semiconductor and the p-type nitride semiconductor that constitute the n-type layer and the p-type layer can be formed.

The relationship between the stripe ridge 20 and the neck portion 21 in the present invention is not limited to the configuration shown in FIG. 3, making the neck portion 21 narrower than the ridge stripe 20 so as to form the tiny light source of the desired shape and size on the neck portion.

That is, while the stripe ridge 20 and the neck portion 21 may be formed as a stripe of substantially uniform width as shown in FIG. 3, the stripe may also be formed in a tapered configuration with the width thereof varying with the position along the longitudinal direction. Specifically, the stripe may be formed in such a tapered configuration as the width of the stripe ridge 20 decreases toward the neck portion 21 and the end face along the longitudinal direction, thereby increasing the efficiency of extracting light by concentrating the light emitted by the stripe ridge 20 into the neck portion 21. The stripe ridge 20 may be tapered over the entire length thereof or in a section thereof, for example from the joint with the neck portion 21 over some length along the stripe 20, as in the example described above. Similar configuration may be employed also for the neck portion 21.

Although the ridge stripe of the present invention is formed midway in depth of the n-type layer 12 as shown in FIG. 3, the present invention is not limited to this configuration, and the ridge stripe 20 may be formed by etching to such a depth that does not reach the active layer 13. When the ridge stripe 20 is formed above the active layer 13, such a structure can be formed as degradation of the active layer 13 due to exposure to atmosphere is retarded. The effect of preventing degradation of the active layer 13 becomes more conspicuous when the stripe is formed with a small width of 10 μm or less. On the other hand, since a desired tiny light source is made by using one end face of the neck portion 21 as a light emerging surface, it is preferable to etch into such a depth that reaches the n-type layer, deeper than the active layer 13. Etching depth in the neck portion 21 and in both sides of the stripe ridge 20 may be changed according to the functions thereof.

While the stripe ridge 20 and the neck portion 21 join at a surface substantially perpendicular to the longitudinal direction of the stripe ridge 20, the present invention is not limited to this configuration. The stripe ridge 20 and the neck portion 21 may also be joined at a surface having an angle less than 90° from the longitudinal direction so that, for example, the joint is also tapered. This configuration makes it possible to efficiently direct light from the stripe ridge 20 to the neck portion 21, and improve the efficiency of extracting light by decreasing the loss of light due to reflection at the joint.

There is no limitation to the shading film that may be made of any material as long as the light emitted by the light emitting element can be shielded, and TiO and SiO that absorb light and metals such as Cr, Ti/Pt, Ti, Ni, Al, Ag and Au may be used. Also at least one kind selected from among a group consisting of $SiO_2$, $TiO_2$, $ZrO_2$, ZnO, $Al_2O_3$, MgO and polyimide may be used to form a multi-layer dielectric film comprising films $\lambda/4$ n thick ($\lambda$ is wavelength and n is the refractive index of the material) of such a material.

Furthermore, the present invention is not limited to nitride semiconductor.

According to the present invention, as described above, various modifications and various materials can be used to achieve the effects of the first embodiment.

Embodiment 2

Now a concentrating point emission type light emitting element according to the second embodiment of the present invention will be described below with reference to the accompanying drawings.

Figure 8:
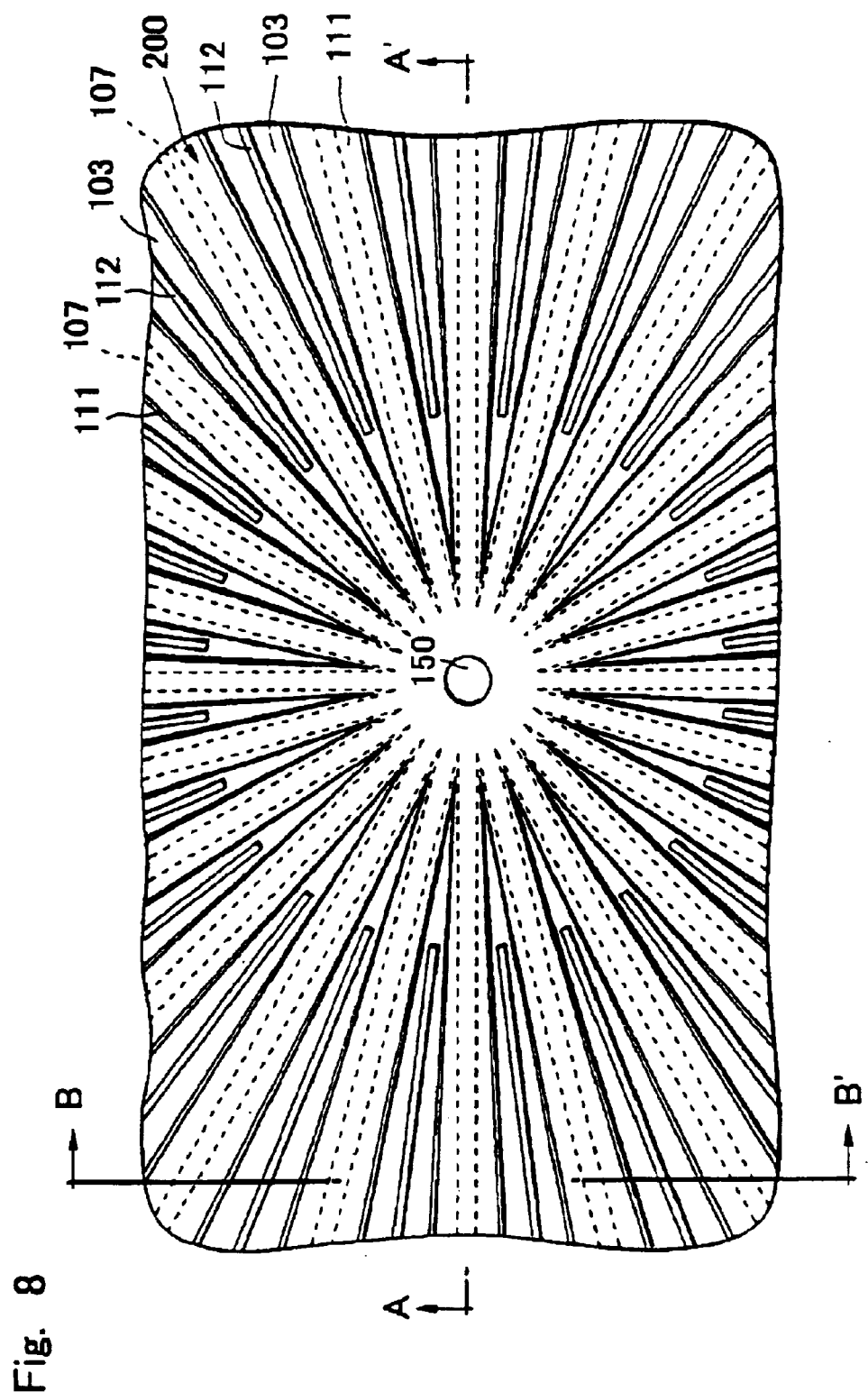
FIG. 8 is a partial plan view of a concentrating point emission type light emitting element according to second embodiment of the present invention.

The concentrating point emission type light emitting element of the second embodiment has a plurality of light emitting regions 200 formed in radial direction around a light emitting point 150 located at the center thereof as shown in FIG. 8, so that light emitted by the light emitting regions 200 is directed through waveguides formed in the light emitting regions 200 to near the center of the radial configuration and emerges from the light emitting point 150.

Figure 9:
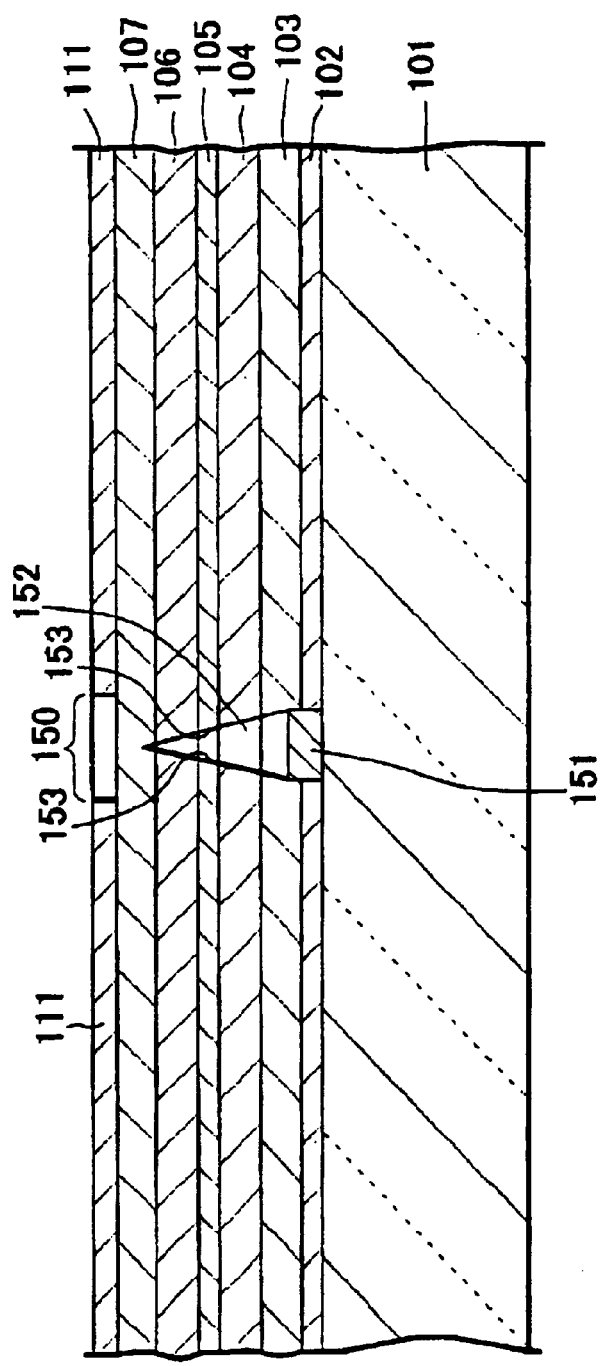
FIG. 9 is a sectional view taken along lines A–A' of FIG. 8.
Figure 10:
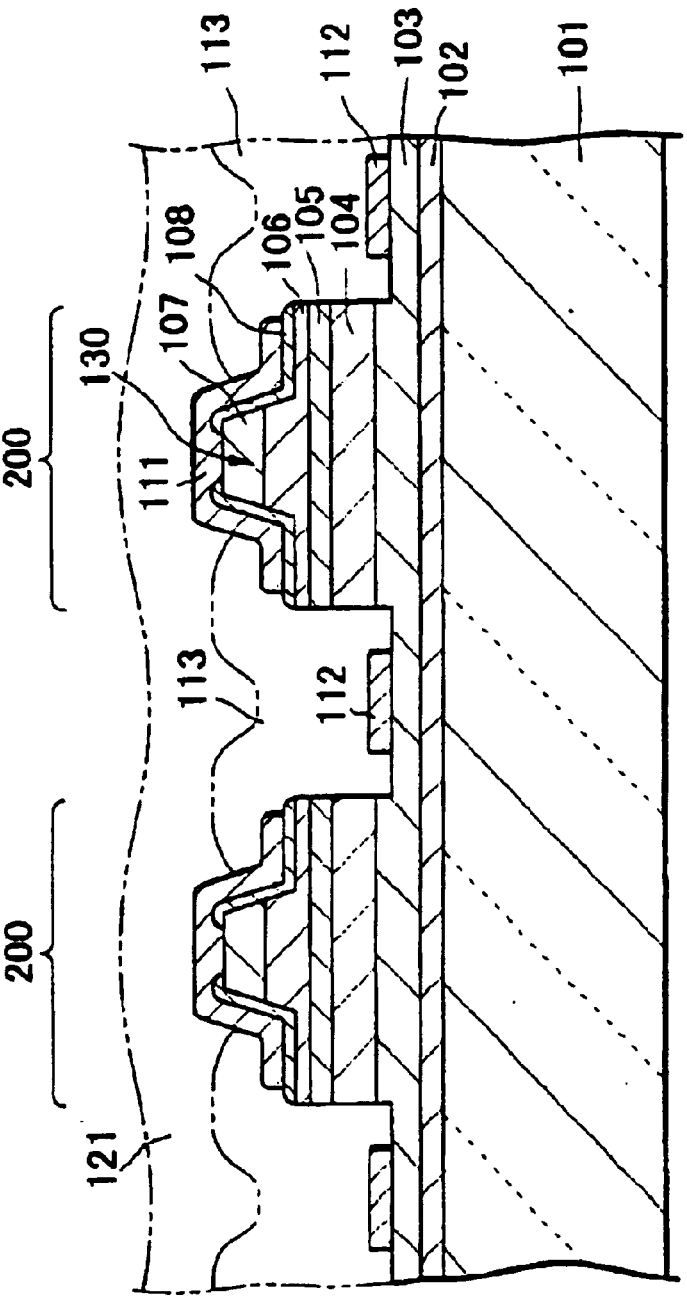
FIG. 10 is a sectional view taken along lines B–B' of FIG. 8.

In the concentrating point emission type light emitting element of the second embodiment, the light emitting regions 200 are formed by etching a stacked semiconductor structure, consisting of a buffer layer 102, an n-type contact layer 103, an n-type cladding layer 104, an active layer 105, a p-type cladding layer 106 and a p-type contact layer 107 formed one on another successively on a substrate 101, until the n-type contact layer 103 is exposed in a radial pattern with the light emitting point 150 located at the center thereof (FIG. 8 through FIG. 10).

Thus a plurality of the light emitting regions 200 having the stacked semiconductor structure are formed, consisting of the buffer layer 102, the n-type contact layer 103, the n-type cladding layer 104, the active layer 105, the p-type cladding layer 106 and the p-type contact layer 107 formed one on another successively on the substrate 101, where the waveguides are directed toward the light emitting point 150 radially, with the n-type contact layer 103 being exposed between adjacent light emitting regions 200 (FIG. 8, FIG. 10).

According to the second embodiment, the active layer 105 is made of InGaN, for example, while the n-type cladding layer 104 and the p-type cladding layer 106 are made of AlGaN, for example, that has larger band gap than the active layer 105, and the light emitting regions 200 have double heterojunction structure. In the second embodiment, the active layer 105 can be formed in various structures such as multiple quantum well structure and single quantum well structure, and the mixing ratio of Al in the n-type cladding layer 104 and in the p-type cladding layer 106 may be set to an appropriate value by taking account of such factors as the confinement of light in the longitudinal direction Further according to the second embodiment, in order to improve the crystallinity, a base layer may be formed by lateral growth so as to form the n-type cladding layer 104, the active layer 105 and the p-type cladding layer 106 thereon.

In the light emitting regions 200 of the concentrating point emission type light emitting element of the second embodiment, a ridge 130 is formed by etching the p-type semiconductor layers (the p-type cladding layer 106 and the p-type contact layer 107) on both sides thereof midway in depth of the p-type cladding layer 106 so that the middle portion of a predetermined width remains, and a p-type electrode 111 is formed to make ohmic contact only with the top surface of the ridge 130 (surface of the p-type contact layer 107 in the ridge 130) via an opening of the insulation film 108 (FIG. 8, FIG. 10).

With this constitution, the active layer located right below the ridge 130 has an effective refractive index higher than that of the active layer on both sides thereof so that light is confined right below the ridge 130 and is directed along the ridge 130.

Width of the ridge is preferably set in a range from 1 to 5 μm, more preferably in a range from 1.5 to 3 μm, in order to effectively direct the light.

Confinement of light in the direction of depth is achieved by sandwiching the active layer 105 with the n-type cladding layer 104 and the p-type cladding layer 106 that have lower refractive index.

According to the second embodiment, it is preferable to form a mirror film for reflecting the light on the end face (used for monitoring and therefore hereinafter referred to as monitoring end face) located opposite to the light emitting point 150 of the light emitting region 200. The mirror film formed on the monitoring end face makes it possible to reduce the loss caused by unnecessary radiation and improve the efficiency of light emission, since light reflected on the end face can be output through the light emitting point 150. In the case of this constitution, light reflected on the monitoring end face can be amplified and output through the light emitting point depending on the conditions, so that more effective light emission can be achieved. The mirror film may be a multi-layer electric film made of $SiO_2$ and $TiO_2$, with the film thickness preferably set to $n\lambda/4$ (n=1, 2, 3 . . . , $\lambda$ is wavelength of light in the dielectric material), and preferably consist of two or more pair of the layers in order to achieve satisfactory reflection characteristic. Further in the second embodiment, it is preferable to form the mirror film from the same material as the insulation film 113 at the same time therewith in the same process, so as to simplify the manufacturing process and reduce the manufacturing cost.

According to the second embodiment, the n-type electrode 112 is formed on the n-type contact layer 103 that is exposed between adjacent light emitting regions 200 (FIG. 8, FIG. 10).

Also according to the second embodiment, a cavity 152 of conical shape that has an apex located in the direction of emerging light is formed in the stacked semiconductor structure right below the light emitting point 150 as shown in FIG. 9, so that light emitted in the light emitting regions 200 is reflected on the conical surface 153 of the cavity 152 upward and is output through an opening (the light emitting point 150) of the p-type electrode 111.

Now the method of manufacturing the concentrating point emission type light emitting element of the second embodiment will be described below by making reference to examples of materials to be used.

(Process to Form a Mask 151)

Figure 11:
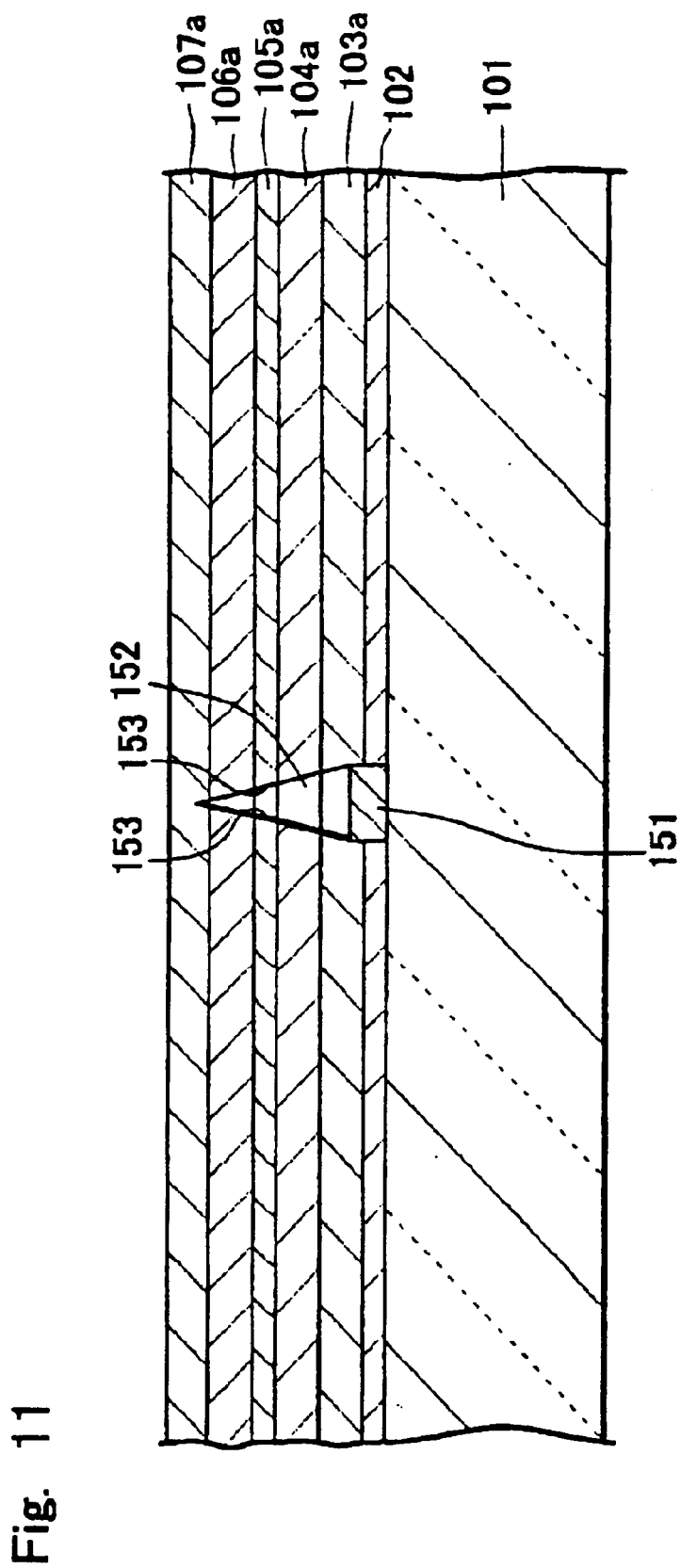
FIG. 11 is a sectional view of stacked semiconductor structure grown in the manufacturing process of the concentrating point emission type light emitting element according to the second embodiment of the present invention.
Figure 12:
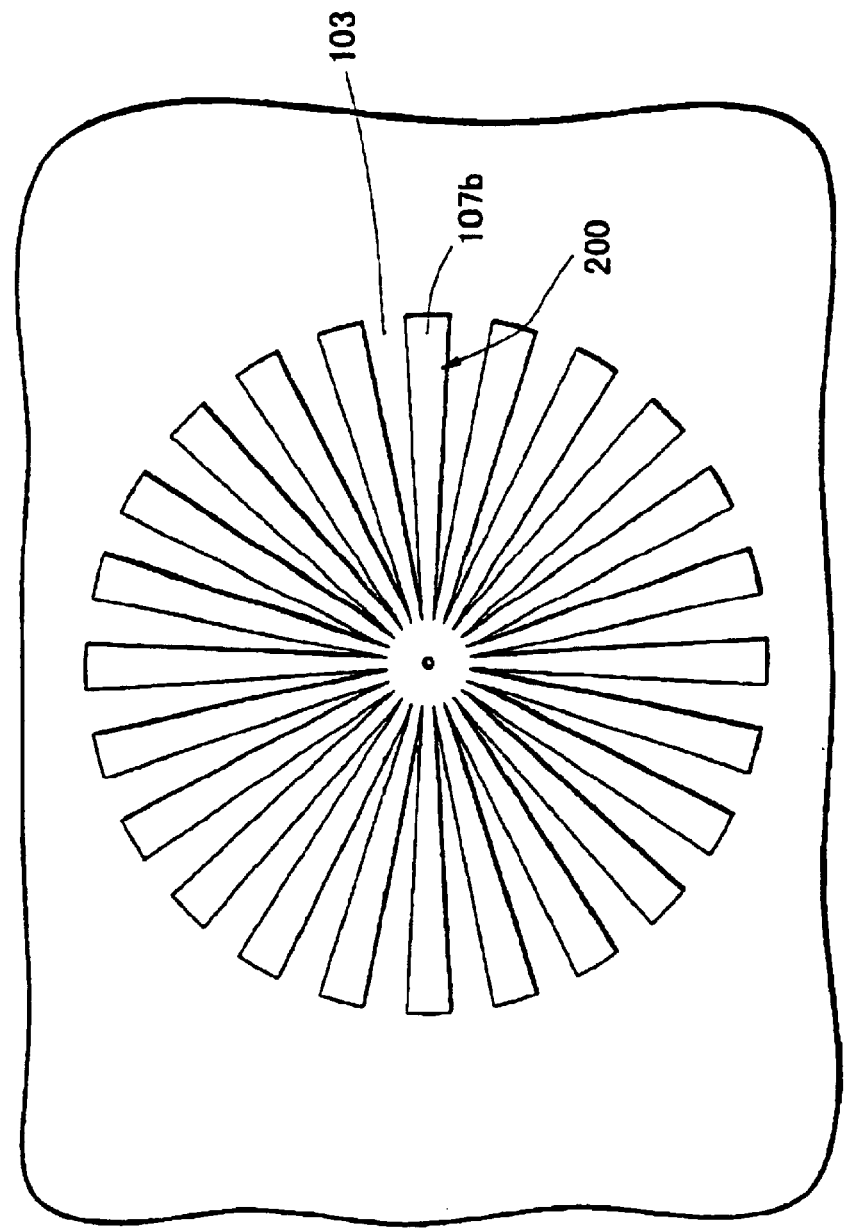
FIG. 12 is a plan view of the stacked semiconductor structure after forming a light emitting region therein in the manufacturing process of the concentrating point emission type light emitting element according to the second embodiment of the present invention.

According to this manufacturing method, a mask 151 is formed for the purpose of forming the cavity 152 on the substrate 101 as shown in FIG. 11.

According to the second embodiment, while insulating substrate such as sapphire or spinel ($MgAl_2O_4$) that has principal plane in C plane, R plane or A plane, or semiconductor substrate such as SiC (including 6H, 4H, 3C), Si, Zn, GaAs, GaN may be used, sapphire substrate or GaN substrate that can be grown with good crystallinity is preferably used when nitride semiconductor is employed.

The substrate 101 is preferably made of a material that has a refractive index higher than that of the semiconductor layer to be formed thereon by 0.2 or more.

The mask 151 is exposed to a high temperature of 1000° C. or higher when growing semiconductor layers in the following process, and therefore must be made of a material that does not decompose at such temperatures and does not allows the semiconductor to grow thereon. As such, $SiO_2$, SiN, W or the like can be used.

The mask 151 is preferably formed in a round (cylindrical) shape, which makes it possible to form the cavity 152 of conical shape in the stacked semiconductor structure that produces spot light of near true circle.

While diameter of the mask 151 is determined according to the required spot diameter, the mask diameter is preferably set in a range from 0.5 to 20 μm, more preferably in a range from 1 to 10 μm in order to obtain satisfactory light of single mode.

(Process to Grow the Semiconductor Layers)

Then the buffer layer 102 having thickness of 200 Å made of GaN, for example, an n-type contact layer 103a made of GaN having thickness of 4 μm doped with $4.5 \times 10^{18}/cm^3$ of Si, for example, an n-type cladding layer 104a made of $Al_{0.1}Ga_{0.9}N$ having thickness of 1 μm doped with $1 \times 10^{18}/cm^3$ of Si, for example, an active layer 105a made of $Tn_{0.37}Ga_{0.63}N$ having thickness of 0.09 μm, for example, a p-type cladding layer 106a made of $Al_{0.1}Ga_{0.9}N$ having thickness of 0.5 μm doped with $2 \times 10^{18}/cm^3$ of Mg, for example, and a p-type contact layer 107a made of p-type GaN having thickness of 150 Å doped with $1 \times 10^{18}/cm^3$ of Mg, for example, are formed successively on the substrate 101 having a mask formed thereon (FIG. 11).

Through the process described above, the stacked semiconductor structure having the cavity 152 of conical shape is formed on the mask 151 as shown in FIG. 11.

(Etching for Forming the Light Emitting Regions)

Then an $SiO_2$ film having thickness of 0.5 μm is formed on the stacked semiconductor structure by the plasma CVD process. This is followed by the formation of a plurality of fan shaped patterns in radial arrangement with the apex located at the center of the mask 51 by photolithography technique, with the $SiO_2$ film being etched by, for example, RIE process The plurality (48 in this embodiment) of fan shaped light emitting regions 200 are formed by etching the portions not covered by the $SiO_2$ film by, for example, the RIE process until the n-type contact layer 103 is exposed (FIG. 5). All the light emitting regions 200 are formed to have the same radial dimension and apex angle of the fan shape, and are connected to each other at the apex. The mask may be made of a material other than $SiO_2$ film, such as dielectric material including SiN or photo-resist material. Further, the mask may be formed by a process other than the plasma CVD, such as magnetron sputter or ECR process.

(Formation of the Ridge)

Figure 13:
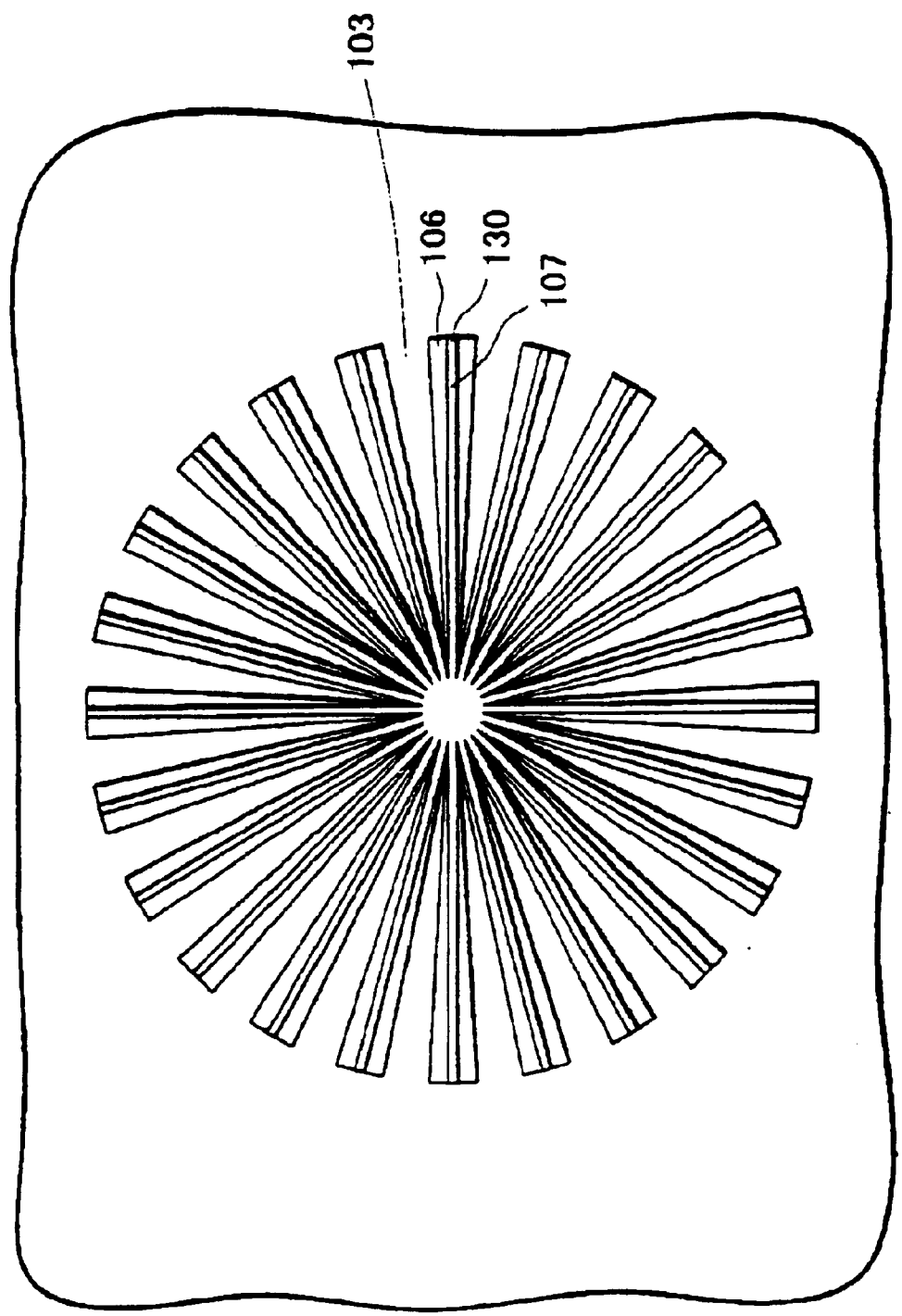
FIG. 13 is a plan view after forming a ridge in each light emitting region in the manufacturing process of the concentrating point emission type light emitting element according to the second embodiment of the present invention.

After forming an etching mask (made of $SiO_2$, for example) of uniform width (for example, 2 μm wide and 0.5 μm thick) for forming the ridges on the top surfaces of the light emitting regions 200, both sides of the etching mask are etched away midway in depth of the p-type cladding layer 106, thereby to form the ridges 130 in the light emitting regions 200 (FIG. 13).

(Formation of the P-Type Electrode)

Figure 14:
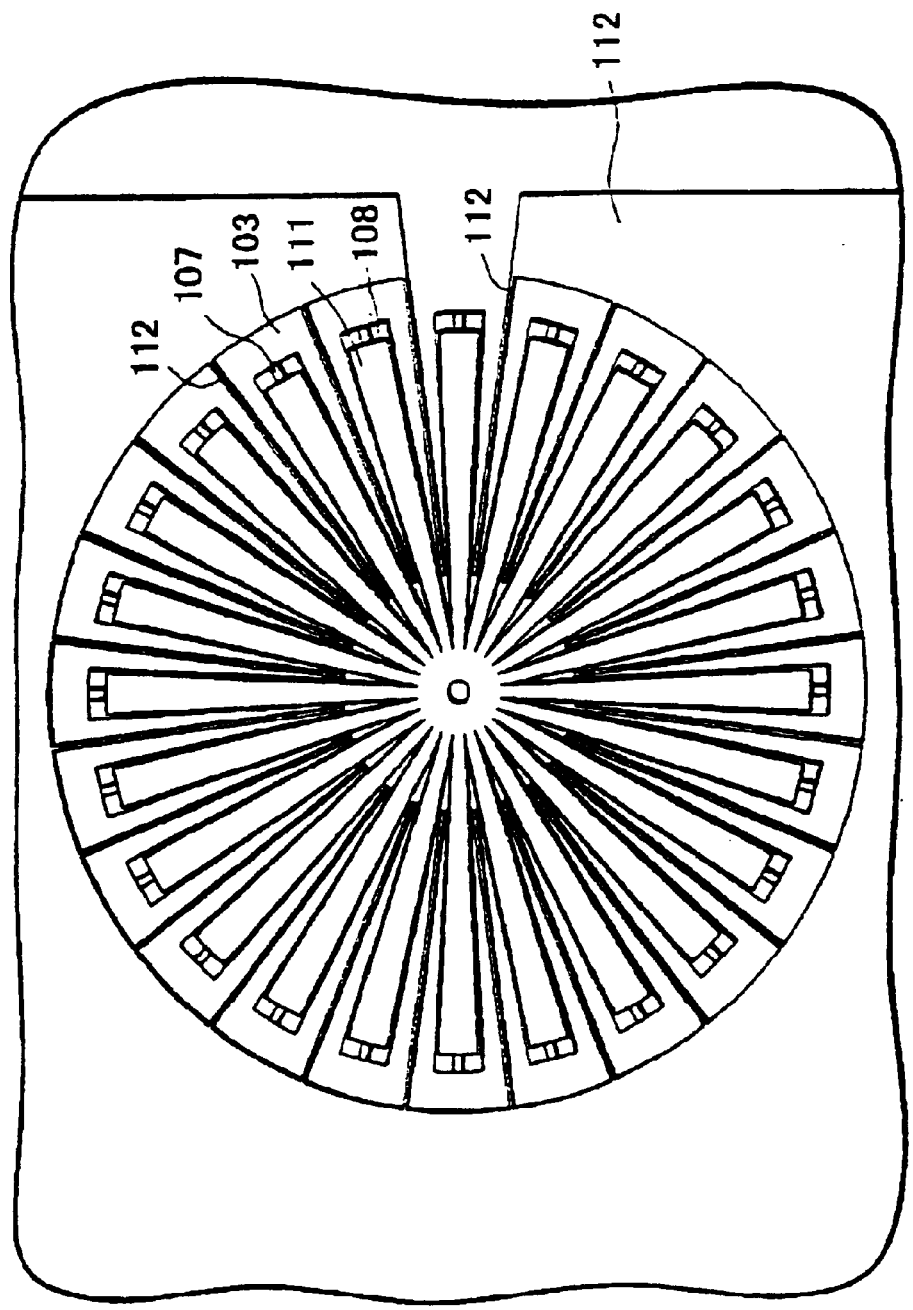
FIG. 14 is a plan view after forming a p-type electrode in each light emitting region and an n-type electrode between adjacent light emitting regions in the manufacturing process for the concentrating point emission type light emitting element according to the second embodiment of the present invention.

Then an insulation layer 8 (for example, $ZrO_2$ film having thickness of 0.2 μm or less) is formed to cover the portions other than the top surfaces of the ridges in the light emitting regions 200, and the p-type electrodes 111 are formed so as to make ohmic contact with only the top surfaces of the ridges that are exposed as shown in FIG. 14.

The p-type electrodes III are formed from Ni (100 Å)/Au (1500 Å), for example, that can make good ohmic contact with the p-type GaN layer.

(Formation of the N-Type Electrode)

Then the n-type electrode 112 is formed on the n-type contact layer 103 that has been exposed between the adjacent light emitting regions (FIG. 14).

The n-type electrode 112 is formed from Ti (100 Å)/Al (5000 Å), for example, that can make good ohmic contact with the n-type GaN layer.

The n-type electrode 112 is formed over the entire surface of the n-type contact layer 103 (over-all electrode section) on the outside, with a predetermined distance in between, of the outer periphery (external arc) of the light emitting regions (outside of a circle having a radius a little larger than the radial dimension of the fan shaped light emitting regions). Plural n-type electrodes 112 formed between the light emitting regions are electrically connected with each other on the over-all electrode section. After forming the n-type electrodes, it is preferable to apply annealing at a temperature not higher than 700° C.

The over-all electrode section is used for the connection with outside circuits.

(Formation of the Insulation Film 113)

Figure 15:
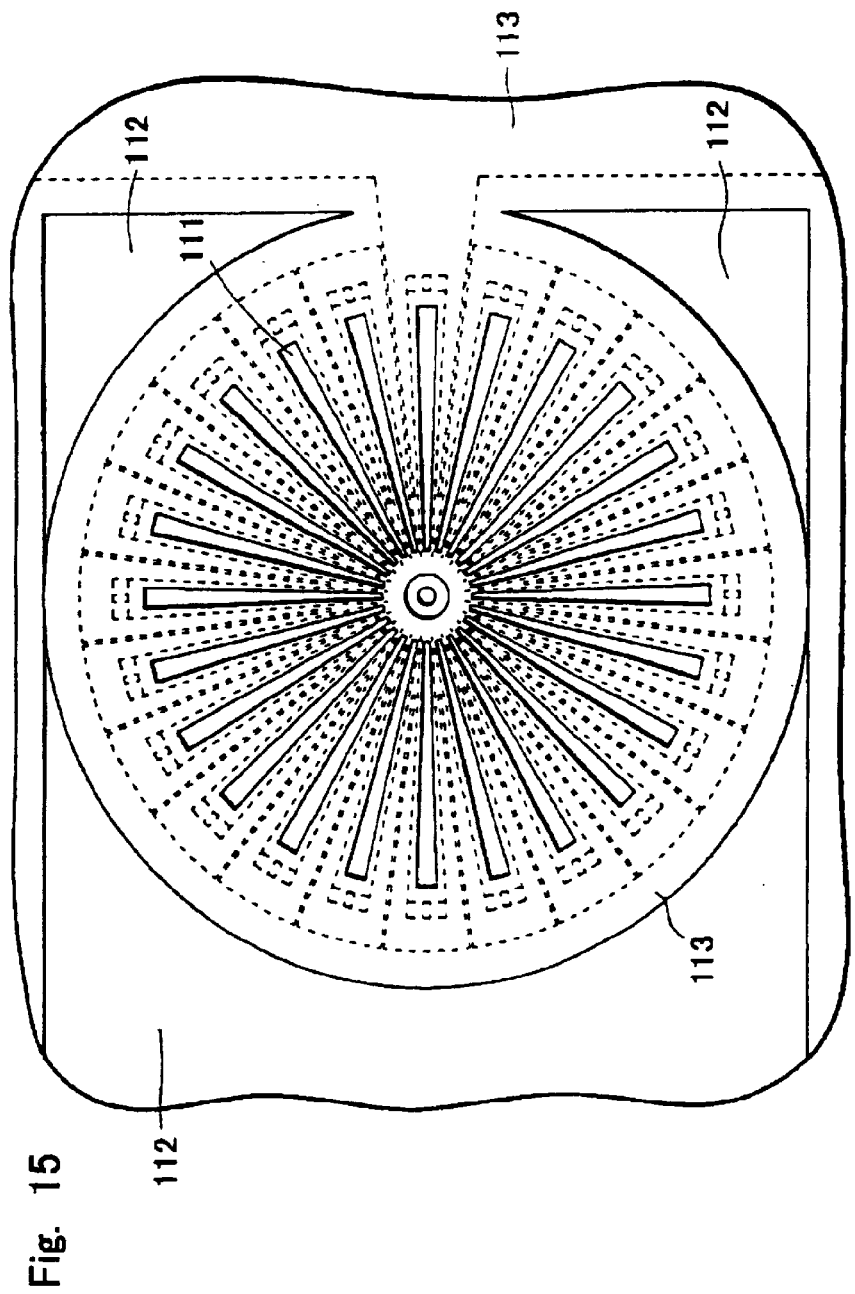
FIG. 15 is a plan view after forming an insulation film 113 that fills the light emitting region in the manufacturing process for the concentrating point emission type light emitting element according to the second embodiment of the present invention.

Then the insulation film 113 is formed to fill the space between the light emitting regions, so as to entirely cover the n-type contact layer 103 that is exposed between the light emitting regions except for the top surface of the p-type electrode 111 (FIG. 10, FIG. 15).

The insulation film 113 is formed so as to cover part of the inner periphery and outer periphery of the over-all electrode section of the n-type electrode 112. That is, the insulation film 113 is formed so as to expose the main part the over-all electrode section of the n-type electrode 112, and the exposed portions of the over-all electrode section is used for the connection with outside circuits.

In the second embodiment, the insulation film 113 also serves as the mirror film located at the end face of the light emitting regions 200, and is therefore formed as a multi-layer film combining a low refractive index material layer and a high refractive index material layer, for example, a multi-layer film of dielectric materials comprising two or more pairs of ($SiO_2$/$TiO_2$). This constitution allows it to increase the reflectivity by increasing the number of pairs of layers. While $SiO_2$ is used as the low refractive index material and $TiO_2$ is used as the high refractive index material to form the multi-layer film that constitutes the insulation film 113 in the example described above, the present invention is not limited to this constitution and the following materials may also be used to form the multi-layer film that serves as the mirror film. For the low refractive index material layer, $MgO_2$, $Al_2O_3$, SiON, MgO and the like can be used besides $SiO_2$. For the high refractive index material layer, $ZrO_2$, $Nb_2O_5$, $Ta_2O_5$, $SiN_x$, AlN, GaN and the like can be used besides $TiO_2$. By combining these materials, the multi-layer film of dielectric materials that does not absorb the light of the emission wavelength can be formed.

(Formation of the p Pad Electrode)

Figure 16:
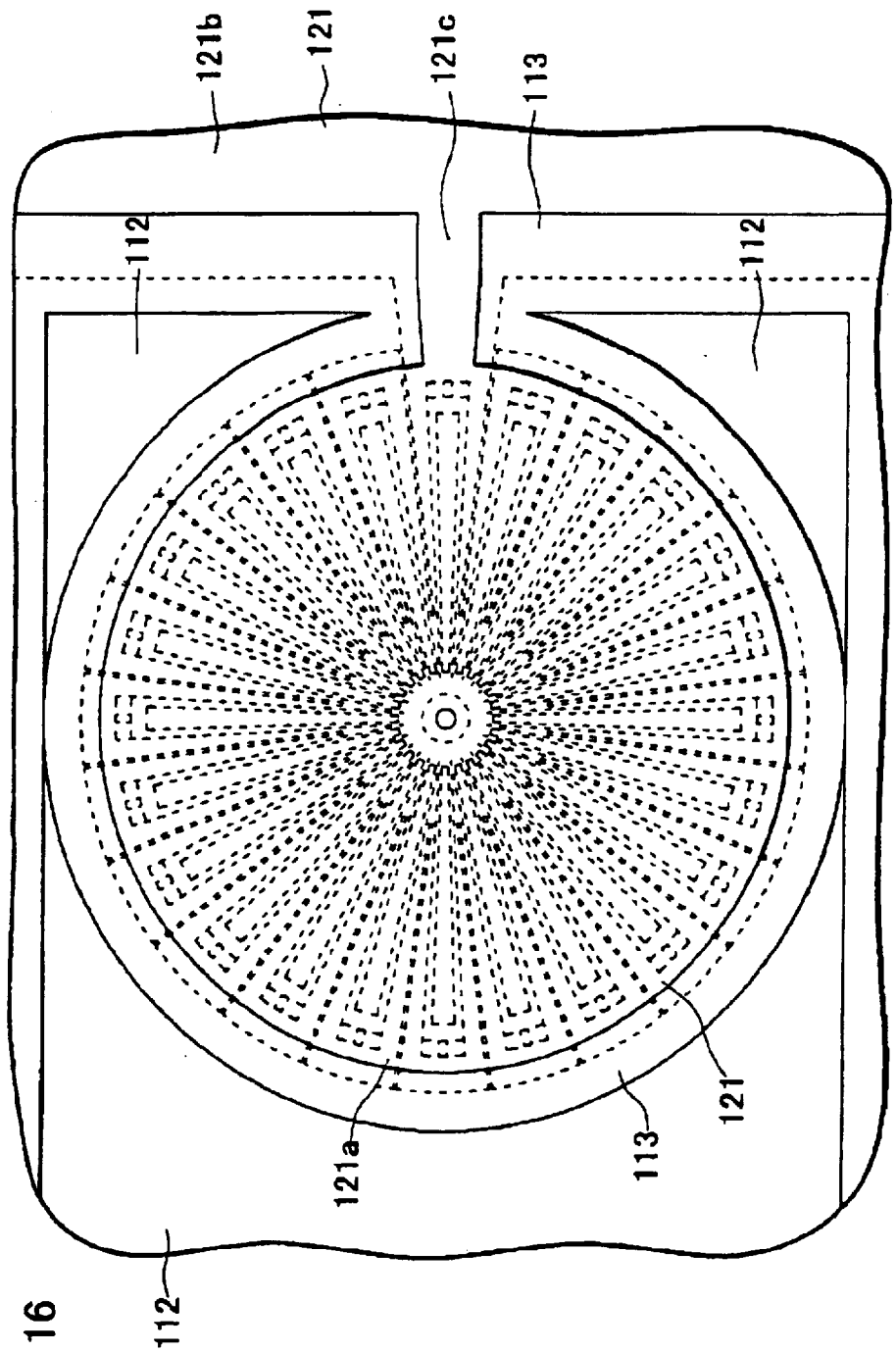
FIG. 16 is a plan view after forming p pad electrodes that connect the p-type electrodes of all light emitting regions in the manufacturing process for the concentrating point emission type light emitting element according to the second embodiment of the present invention.

Then a p pad electrode 121 is formed as shown in FIG. 16 that comprises a portion 121a of round shape (a circle having a radius substantially equal to the radial dimension of the fan shaped light emitting region with the center at the light emitting point) for connecting the exposed p-type electrode 111 and a pad portion 121b that is connected to the round portion 121a via the neck portion 21c. The p pad electrode is formed from Ni (1000 Å)/Ti (1000 Å)/Al (8000 Å), for example.

(Formation of the N pad Electrode)

Then the n pad electrode 122 is formed on the n-type electrode 112 that has been exposed, for the purpose of bonding for electrical connection to the n-type electrode 112. The n pad electrode is formed from Ni (1000 Å)/Ti (1000 Å)/Al (8000 Å), for example.

Figure 17:
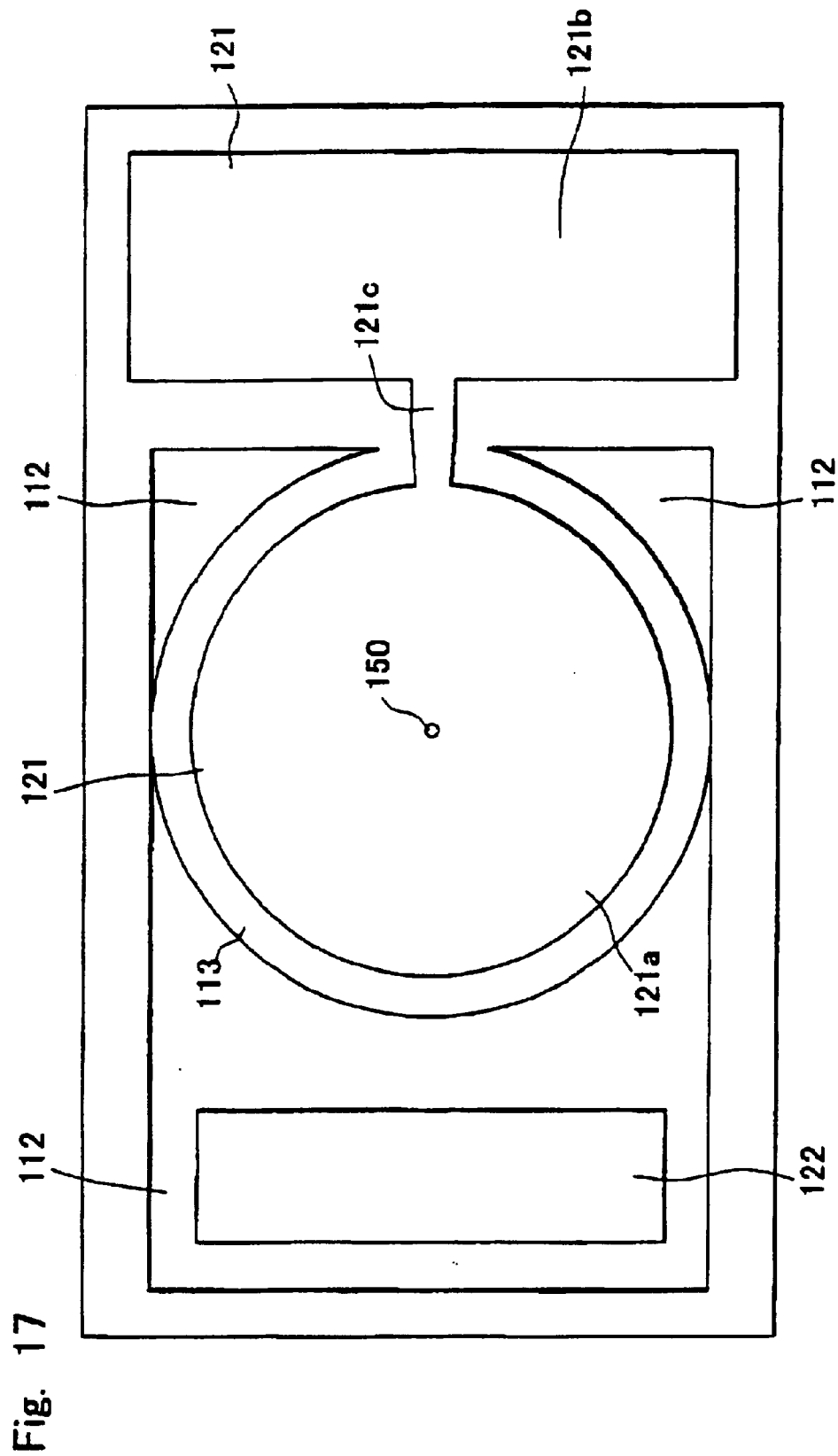
FIG. 17 is a plan view showing the electrodes arrangement in the concentrating point emission type light emitting element according to the second embodiment of the present invention.

The concentrating point emission type light emitting element of the second embodiment that has the electrode arrangement shown in FIG. 17 is manufactured as described above.

Since the concentrating point emission type light emitting element of the second embodiment that has the constitution described above has the waveguide formed in each light emitting region, light emitted from the light emitting regions 200 is directed through the waveguide toward the light emitting point, reflected on the conical surface of the cavity 152 and is output through the light emitting point 150 that is the opening formed in the p-type electrode.

With this constitution, since light emitted from the light emitting regions 200 is concentrated at the light emitting point 150 and is output therefrom, light emission with high luminance is achieved.

Also in the concentrating point emission type light emitting element of the second embodiment, since the reflector surface having conical shape is constituted from the cavity 152 of conical shape, spot light of near true circle can be obtained.

Also in the concentrating point emission light emitting element of the second embodiment, the cavity 152 of extremely small conical shape of the diameter of the circular mask 151 can be easily formed, and satisfactory spot light of single mode can be obtained.

Since the concentrating point emission type light emitting element of the second embodiment has the stacked semiconductor structure formed with the gallium nitride compound semiconductor element, spot light of relatively short wavelengths such as yellow, blue and violet colors as well as ultraviolet region can be obtained.

Variation of Embodiment 2

Although the reflector surface having conical shape is constituted from the cavity 152 of conical shape in the second embodiment, the present invention is not limited to this constitution and a refracting surface having conical shape may be formed as described below, so that concentrated light is output from the light emitting point.

Figure 18:
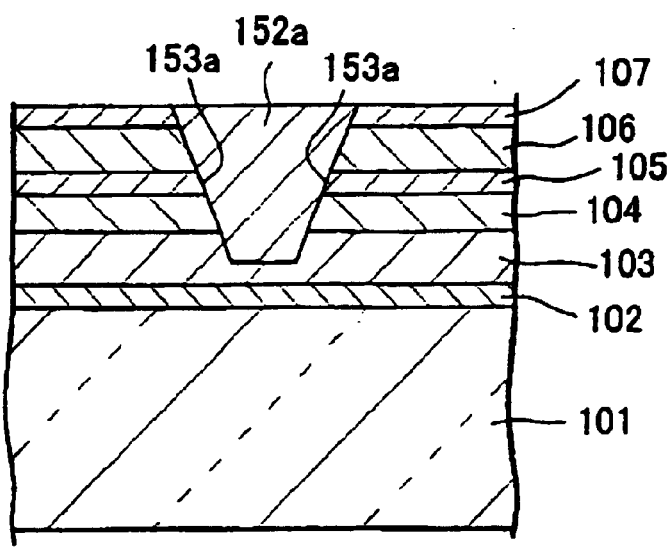
FIG. 18 is a sectional view showing the constitution of a refracting pyramidal surface of a variation according to the present invention.

Specifically, as shown in FIG. 18, in the stacked semiconductor structure located right below the light emitting point, such a recess of pyramidal shape is formed so as to reach at least the n-type semiconductor layer that expands toward the light emerging point, and the recess is filled with a transparent material 152a that has a refractive index higher than that of the active layer.

With the constitution described above, light emitted in the light emitting regions and directed toward the light emerging point is refracted due to the difference in the refraction index between the semiconductor layer (mainly the active layer) and the transparent material 152a that has a high refractive index in the conical surface of the recess, so as proceed upward in the transparent material 152a.

Thus light is output through the light emitting point 150 upward.

Effects similar to those of the second embodiment can also be achieved with the constitution described above.

Figure 19:
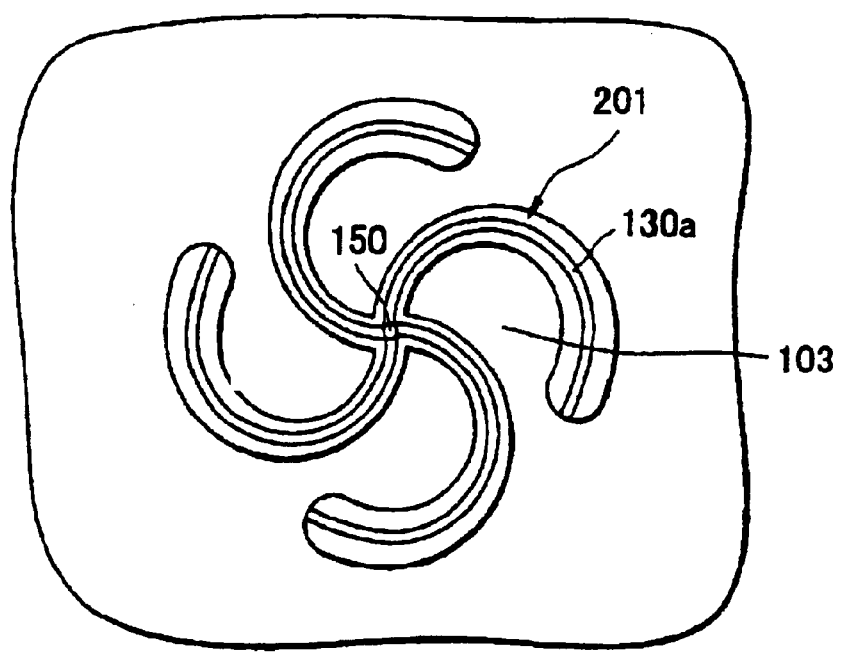
FIG. 19 is a plan view showing the light emitting region of a variation according to the present invention.

Although the light emitting regions are formed in straight lines arranged radially around the light emitting point at the center in the second embodiment, the present invention is not limited to this configuration and curved light emitting regions 201 may be formed as shown in FIG. 19.

Effects similar to those of the second embodiment can also be achieved and the light emitting regions may be made longer with the constitution described above.

Although the concentrating point emission light emitting element of the second embodiment is made in such a constitution that has the light emitting regions of double heterojunction structure wherein the n-type contact layer 103, the n-type cladding layer 104, the active layer 105, the p-type cladding layer 106 and the p-type contact layer 107 that are formed from gallium nitride compound semiconductor element are grown one on another successively, the present invention is not limited to this constitution and it suffices to employ such a structure as at least the active layer is capable of confining light in the direction of thickness sandwiched by layers of higher refractive index (smaller band gap) than the active layer.

n-type and p-type optical guide layers may also be formed between the n-type cladding layer 104 and the active layer 105 and between the active layer and the p-type cladding layer 106.

Also the light emitting regions are formed in fan shape in the second embodiment, but the present invention is not limited to this configuration.

Moreover, while gallium nitride compound is used in the second embodiment, the present invention is not limited to this configuration and other semiconductors such as GaAs or InGaP may be used.

Furthermore, although the pyramidal surface is formed in conical shape in the second embodiment, the present invention is not limited to this configuration. For example, such a pyramidal surface may be employed that consists of faces inclined so that light propagating in the waveguide of the light emitting regions is refracted or reflected so as to be directed upward (perpendicular to the surface).

Also the second embodiment has been described by taking a particular stacked semiconductor structure as an example, but the present invention is not limited to this constitution.

Besides the stacked semiconductor structure described above, for example, such a stacked semiconductor structure may be employed as described below: the buffer layer 102 having thickness of 200 Å made of AlGaN, an undoped n-type GaN layer, the n-type contact layer 103 made of GaN having total thickness of 4 μm doped with $2.5 \times 10^{18}/cm^3$ of Si, a crack prevention layer made of $In_x Ga_{1-x}N$ ($0.1 \leq x \leq 0.15$) having thickness of 1000 to 1500 Å, a cladding layer made of GaN, an n-type guide layer having thickness of 2000 Å made of Si-doped (InGaN/GaN) of super lattice structure, six sets of (GaN barrier layer/InGaN active layer/GaN cap layer) for light emitting layer and a last barrier layer made of GaN are formed on the substrate 101 having a mask formed thereon. Then a p-type cap layer made of $Al_x Ga_{1-x}N$ ($0 \leq x \leq 0.35$) doped with Mg having thickness of 100 to 350 Å, a p-type guide layer having thickness of 2000 Å or less made of Mg-doped (InGaN/GaN) of super lattice structure, a p-type cladding layer having thickness of 6000 Å or less made of Mg-doped GaN, and a p-type contact layer having thickness from 150 to 200 Å made of Mg-doped p-type GaN may be formed successively into stacked semiconductor structure.

Figure 20:
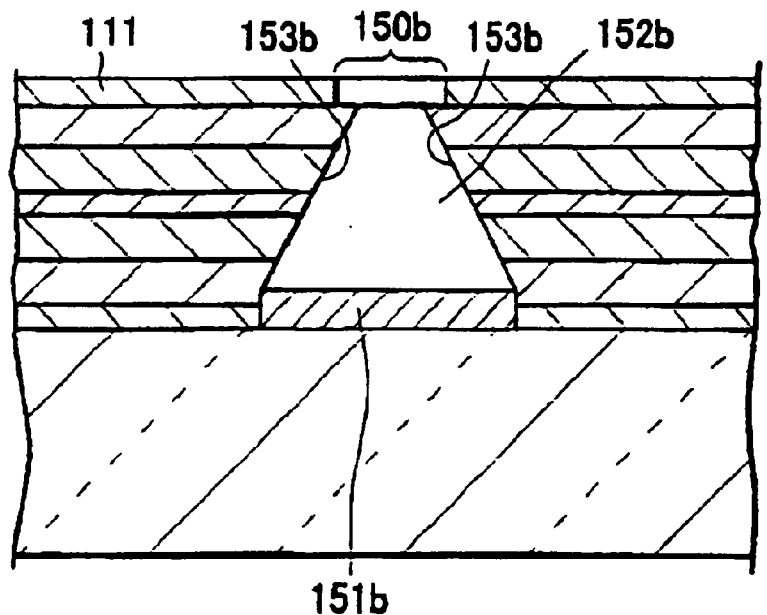
FIG. 20 is a sectional view showing the constitution of a cavity 152b (opening at the top) of a variation according to the present invention.

Although the cavity 152 that is closed at the apex is formed below the light emitting point 150 in the second embodiment, the present invention is not limited to this configuration and a pyramidal cavity 152b (having pyramidal surface 153b) that opens at the top may be used as shown in FIG. 20.

Figure 21A:
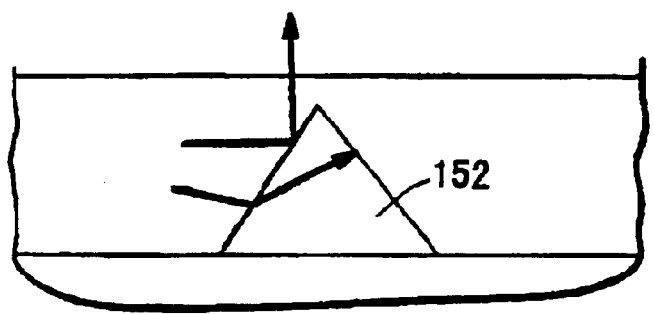
FIG. 21 is schematic sectional view showing the state of emitting light in the case of using a cavity closed at the top (a) and in the case of using a cavity open at the top (b)
Figure 21B:
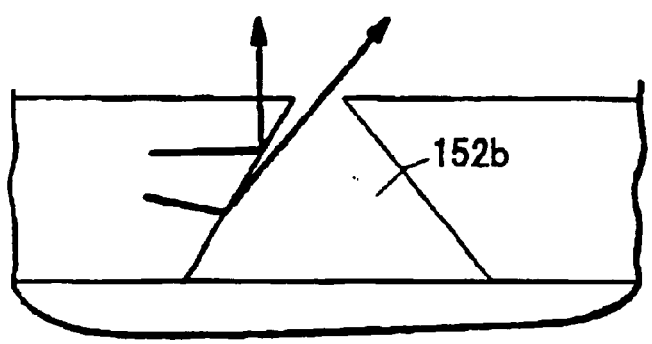

Such a constitution with the cavity that opens at the top makes it possible to emit light to the outside more efficiently than the closed cavity 152 (FIG. 21A) since light entering the cavity emerges to the outside without being confined within the cavity as shown in FIG. 21B.

What is claimed is:

1. A point emission type light emitting element comprising:
    a stripe ridge having an n-type layer, an active layer and a p-type layer that are formed from semiconductors on a substrate, so as to emit light from one end face of the stripe ridge,
    wherein the stripe ridge has a protruding portion on the end face and the surface of the light emitting element is covered with a shading film except for the tip of the protruding portion, and
    wherein the shading film comprises a material selected from the group consisting of Cr/Ni, Cr, Ti/Pt, Ti, Ni, Al, Ag and Au.

2. The point emission type light emitting element according to claim 1, wherein said n-type layer, said active layer and said p-type layer comprise nitride semiconductor.

3. The point emission type light emitting element according to claim 1, wherein the width of the stripe ridge is in a range from 1 μm to 100 μm.

4. The point emission type light emitting element according to claim 1, wherein the width of the protruding portion is in a range from 1 μm to 10 μm.

5. The point emission type light emitting element according to claim 1, wherein the ridge stripe is formed by etching to a depth that does not reach the active layer and the protruding portion is formed by etching to a depth that reaches the n-type layer.

6. A point emission type light emitting element comprising:
    a stripe ridge having an n-type layer, an active layer and a p-type layer that are formed from semiconductors on a substrate, so as to emit light from one end face of the stripe ridge,
    wherein the stripe ridge has a protruding portion on the end face and the surface of the light emitting element is covered with a shading film except for the tip of the protruding portion, and
    wherein the shading film comprises $TiO_2$.

7. The point emission type light emitting element according to claim 6, wherein said n-type layer, said active layer and said p-type layer comprise nitride semiconductor.

8. The point emission type light emitting element according to claim 6, wherein the width of the stripe ridge is in a range from 1 μm to 100 μm.

9. The point emission type light emitting element according to claim 6, wherein the width of the protruding portion is in a range from 1 μm to 10 μm.

10. The point emission type light emitting element according to claim 6, wherein the ridge stripe is formed by etching to a depth that does not reach the active layer and the protruding portion is formed by etching to a depth that reaches the n-type layer.

* * * * *